United States Patent
Iwashita

(10) Patent No.: US 8,043,795 B2
(45) Date of Patent: Oct. 25, 2011

(54) METHOD OF FORMING RESIST PATTERN

(75) Inventor: Jun Iwashita, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 257 days.

(21) Appl. No.: 12/441,704

(22) PCT Filed: Sep. 18, 2007

(86) PCT No.: PCT/JP2007/068089
§ 371 (c)(1),
(2), (4) Date: Mar. 17, 2009

(87) PCT Pub. No.: WO2008/035676
PCT Pub. Date: Mar. 27, 2008

(65) Prior Publication Data
US 2010/0062379 A1    Mar. 11, 2010

(30) Foreign Application Priority Data

Sep. 19, 2006 (JP) .................................. 2006-253186

(51) Int. Cl.
G03F 7/00 (2006.01)
G03F 7/004 (2006.01)
G03F 7/26 (2006.01)
G03F 7/40 (2006.01)

(52) U.S. Cl. ........ 430/312; 430/331; 430/913; 430/927; 430/322; 430/273.1

(58) Field of Classification Search ............... 430/270.1, 430/273.1, 312, 331, 913, 927, 322
See application file for complete search history.

(56) References Cited

U.S. PATENT DOCUMENTS

| | | | | |
|---|---|---|---|---|
| 5,686,223 | A | * | 11/1997 | Cleeves ........................ 430/312 |
| 6,228,552 | B1 | | 5/2001 | Okino et al. |
| 6,306,555 | B1 | * | 10/2001 | Schulz et al. .............. 430/270.1 |
| 6,309,795 | B1 | * | 10/2001 | Abe et al. .................. 430/285.1 |
| 6,555,607 | B1 | | 4/2003 | Kanda et al. |

(Continued)

FOREIGN PATENT DOCUMENTS

EP    1 152 036 A1    11/2001

(Continued)

OTHER PUBLICATIONS

Ebihara, et al., Beyond k1=0.25 lithography: 70nm L/S patterning using KrF Scanners, Proceedings of SPIE, Sep. 9, 2003, vol. 5256, Part 2, p. 985 to 994.

(Continued)

*Primary Examiner* — Amanda C. Walke
(74) *Attorney, Agent, or Firm* — Knobbe Martens Olson & Bear LLP

(57) ABSTRACT

Disclosed is a method of forming a resist pattern, including: applying a positive resist composition on a support 1 to form a first resist film 2; selectively exposing the first resist film 2 through a first mask pattern, and developing it to form a first resist pattern 3; applying a negative resist composition including an organic solvent (S") containing an alcohol-based organic solvent on the support 1 that the first resist pattern 3 is formed, thereby forming a second resist film 6; and selectively exposing the second resist film 6 through a second mask pattern, and developing it to form a resist pattern denser than the first resist pattern 3.

9 Claims, 1 Drawing Sheet

U.S. PATENT DOCUMENTS

| | | | |
|---|---|---|---|
| 6,593,063 B1 | 7/2003 | Tanaka et al. | |
| 6,806,026 B2 * | 10/2004 | Allen et al. | 430/270.1 |
| 7,074,543 B2 | 7/2006 | Iwai et al. | |
| 7,473,512 B2 * | 1/2009 | Houlihan et al. | 430/273.1 |
| 7,528,279 B2 * | 5/2009 | Hatakeyama et al. | 560/220 |
| 7,862,986 B2 * | 1/2011 | Yang | 430/313 |
| 2003/0045076 A1 | 3/2003 | Hayashida | |
| 2003/0104319 A1 | 6/2003 | Lin et al. | |
| 2003/0152864 A1 * | 8/2003 | Araki et al. | 430/270.1 |
| 2003/0156992 A1 | 8/2003 | Anderson et al. | |
| 2004/0058269 A1 | 3/2004 | Hada et al. | |
| 2004/0241576 A1 * | 12/2004 | Iwashita et al. | 430/270.1 |
| 2005/0079440 A1 | 4/2005 | Hatakeyama et al. | |
| 2005/0124828 A1 * | 6/2005 | Breyta et al. | 560/219 |
| 2005/0202340 A1 | 9/2005 | Houlihan et al. | |
| 2006/0160028 A1 * | 7/2006 | Lee et al. | 430/312 |
| 2006/0234154 A1 | 10/2006 | Nishimura et al. | |

FOREIGN PATENT DOCUMENTS

| | | |
|---|---|---|
| JP | H04-071222 | 3/1992 |
| JP | H05-055102 | 3/1993 |
| JP | 08-044070 | 2/1996 |
| JP | 2000-147783 | 5/2000 |
| JP | 2002-305135 | 10/2002 |
| JP | 2003-241385 | 8/2003 |
| JP | 2004-220009 | 8/2004 |
| JP | 2006-145788 A | 6/2006 |
| WO | WO 00/67072 A1 | 11/2000 |
| WO | WO 2004/074936 | 9/2004 |
| WO | WO 2004/076495 A1 | 9/2004 |
| WO | WO 2006/054432 A1 | 5/2006 |

OTHER PUBLICATIONS

Lee et al., Double exposure technology using silicon containing materials, Proceedings of SPIE, vol. 6153, Part 1, 61531K-1-8.

Nakamura et al., Contact Hole Formation by Multiple Exposure Technique in Ultra-low $k_1$, Lithography, Optical Microlithography XVII, Proceedings of SPIE vol. 5377, No. 1, p. 255-263, (2004).

International Search Report for corresponding PCT Application No. PCT/JP2007/068089, dated Nov. 13, 2007.

Gil, D. et al. "First Microprocessors with Immersion Lithography", Proceedings of SPIE, vol. 5754, pp. 119-128 (2005).

Borodovsky, Yan, "Marching to the beat of Moore's Law", Proceedings of SPIE, vol. 6153, pp. 615301-1 to 615301-19 (2006).

Office Action issued in corresponding Japanese Patent Application No. 2004-331136, dated Jan. 27, 2009.

Office Action issued in corresponding Japanese Patent Application No. 2004-360297, dated Jan. 27, 2009.

Supplementary European Search Report issued in corresponding European Patent Application No. 05806132.6, dated May 25, 2010.

International Search Report from PCT/JP2005/020420, dated Jan. 31, 2006.

\* cited by examiner

METHOD OF FORMING RESIST PATTERN

RELATED APPLICATIONS

This application is the U.S. National Phase filing under 35 U.S.C. §371 of PCT/JP2007/068089, filed Sep. 18, 2007, which designated the United States and was published in a language other than English, which claims priority under 35 U.S.C. §119(a)-(d) to Japanese Patent Application No. 2006-253186, filed Sep. 19, 2006. The contents of these applications are incorporated herein by reference in their entireties.

TECHNICAL FIELD

The present invention relates to a method of forming a resist pattern.

BACKGROUND ART

The technology (pattern formation technology) of forming a fine pattern on a substrate and performing etching using the formed pattern as a mask, thereby processing a lower layer of the pattern, is adopted for producing an integrated circuit (IC) and the like in the semiconductor industry, and thus it has received great attention.

These types of fine patterns are formed from an organic material, and are formed, for example, using a lithography method, a nanoimprint method or the like. For example, lithography techniques include processes in which, for example, a resist film formed from a resist composition containing a base component such as a resin is formed on a support such as a substrate, the resist film is selectively exposed with irradiation such as light, an electron beam or the like through a mask (mask pattern) in which a predetermined pattern has been formed, and then a developing treatment is conducted, thereby forming a resist pattern of the prescribed shape in the resist film. A resist composition in which the exposed portions change to become soluble in a developing liquid is termed a positive resist composition, whereas a resist composition in which the exposed portions change to become insoluble in the developing liquid is termed a negative resist composition.

Then, the substrate is processed by etching using this resist pattern as a mask, thereby producing a semiconductor element or the like.

In recent years, advances in lithography techniques have led to rapid progress in the field of miniaturization. Typically, these miniaturization techniques involve shortening the wavelength of the exposure light source. Conventionally, ultraviolet radiation typified by g-line and i-line radiation has been used, but nowadays KrF excimer lasers and ArF excimer lasers are starting to be introduced in mass production. For example, by a lithography technique using ArF excimer lasers, a pattern formation with 45 nm-level resolution is now possible. Also, in order to further improve the resolution, research is also being conducted into lithography techniques that use $F_2$ excimer lasers, electron beams (EB), extreme ultraviolet radiation (EUV) and X-rays, which have a shorter wavelength than the ArF excimer lasers and the KrF excimer lasers.

Resist compositions are required to have lithography properties such as high sensitivity to the aforementioned light source and enough resolution to reproduce patterns with very fine dimensions. As a resist composition which meets such requirements, there is used a chemically-amplified resist composition including a base component which exhibits changed solubility in an alkali developing solution under action of an acid, and an acid generator which generates an acid upon exposure (for example, see Patent Document 1). For example, a chemically-amplified positive resist typically includes, as a base component, a resin which exhibits increased solubility in an alkali developing solution under the action of an acid. When an acid is generated from the acid generator upon exposure in the formation of a resist pattern, the exposed portions are converted to an alkali-soluble state.

As a technique for further improving the resolution, a lithography method called liquid immersion lithography (hereinafter, frequently referred to as "immersion exposure") is known in which exposure (immersion exposure) is conducted in a state where the region between the objective lens of an exposure apparatus and the resist layer formed on a wafer is filled with a solvent (an immersion medium) that has a larger refractive index than the refractive index of air (see for example, Non-Patent Document 1).

According to this type of immersion exposure, it is considered that such high resolution as in the case of using a shorter wavelength light source or a larger NA lens can be attained by using an exposure light source with the same wavelength as used conventionally, without lowering of the depth of focus. Furthermore, immersion exposure can be conducted using a conventional exposure apparatus. As a result, it is expected that immersion exposure will enable the formation of resist patterns of higher resolution and superior depth of focus at lower costs. Accordingly, in the production of semiconductor devices, which requires enormous capital investment, immersion exposure is attracting considerable attention as a method that offers significant potential in the semiconductor industry, both in terms of cost and in terms of lithography properties such as resolution.

Immersion lithography is effective in forming patterns having various shapes. Further, immersion exposure is expected to be capable of being used in combination with currently studied super-resolution techniques, such as a phase shift method and a modified illumination method. Currently, as the immersion exposure technique, a technique using an ArF excimer laser as an exposure source is being actively studied, and water is mainly used as the immersion medium.

As a lithography technology which has been newly-proposed recently, there is a double patterning method in which a resist pattern is formed by conducting patterning more than once (see Non-Patent Documents 2 and 3).

According to the double patterning method, for example, it is considered that a first resist pattern is formed on a support using a first resist composition, and subsequently patterning is conducted using a second resist composition on the support that the first resist pattern is formed, therefore a resist pattern with higher resolution than the resist pattern formed through a single patterning can be formed.

[Patent Document 1] Japanese Unexamined Patent Application, First Publication No. 2003-241385.

[Non-Patent Document 1] Proceedings of SPIE, Vol. 5754, pp. 119-128 (2005).

[Non-Patent Document 2] Proceedings of SPIE, Vol. 5256, pp. 985-994 (2003).

[Non-Patent Document 3] Proceedings of SPIE, Vol. 6153, pp. 615301-1 to 19 (2006).

DISCLOSURE OF THE INVENTION

Problems to be Solved by the Invention

However, if a resist pattern is formed by the use of the double patterning method as described above, it is difficult to actually form a resist pattern with high resolution due to problems such that, when a second resist composition is applied onto a support that a first resist pattern is formed, a phenomenon that the second resist composition and the first resist pattern dissolve each other, that is, the so-called mixing phenomenon, is caused.

The present invention takes the above circumstances into consideration, with an object of providing a novel method of forming a resist pattern which enables a resist pattern with high resolution.

Means for Solving the Problems

To achieve the above object, the present invention employs the following constitutions.

A first aspect of the present invention is a method of forming a resist pattern which includes: applying a positive resist composition to form a first resist film on a support; conducting selective exposure of the first resist film through a first mask pattern, and developing the first resist film to form a first resist pattern; applying a negative resist composition containing an organic solvent (S") having an alcohol-based organic solvent on the support that the first resist pattern is formed to form a second resist film; conducting selective exposure of the second resist film through a second mask pattern, and developing the second resist film to form a resist pattern denser than the first resist pattern.

In the present specification and claims, the term "exposure" is used as a general concept involving irradiation with any form of radiation.

EFFECTS OF THE INVENTION

According to the present invention, there is provided a novel method of forming a resist pattern which enables a resist pattern with high resolution to be formed.

BRIEF DESCRIPTION OF THE REFERENCED NUMERALS

Figure 1A:
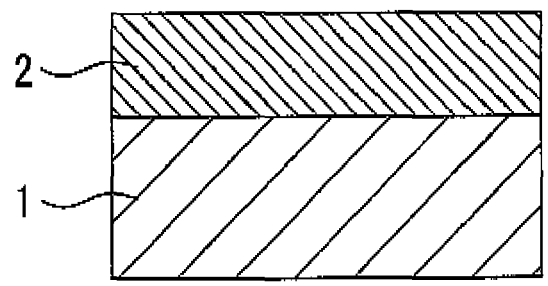
FIGS. 1A to 1D show a schematic process drawing explaining a preferable mode of the method of forming a resist pattern of the present invention.

1 ... support, 2 ... first resist film, 3 ... first resist pattern, 6 ... second resist film, 7 ... second resist pattern

BEST MODE FOR CARRYING OUT THE INVENTION

Method of Forming Resist Pattern

The method of forming a resist pattern of the present invention is a method using a positive resist composition and a negative resist composition.

The positive resist composition and negative resist composition are preferably chemically-amplified resist compositions.

As the chemically-amplified resist composition, a chemically-amplified resist composition is typically used which includes a base component (A) (hereinafter, referred to as component (A)) which exhibits changed solubility in an alkali developing solution under action of an acid, and an acid generator component (B) (hereinafter, referred to as component (B)) which generates an acid upon exposure, which are dissolved in an organic solvent (S) (hereinafter, referred to as component (S)).

Here, the term "base component" means an organic compound which has a film-forming performance, and the molecular weight thereof is preferably 500 or more. When the molecular weight of the organic compound is 500 or more, the film-forming performance can be improved, and a nano-level resist pattern can easily be formed.

The organic compounds whose molecular weight is 500 or more can be classified broadly into a low molecular weight organic compound (hereinafter, referred to as low molecular weight compound) whose molecular weight is within the range of 500 to 2,000, and a resin (polymer) whose molecular weight is more than 2000. As the low molecular weight compound, a non-polymer is typically used. In the case of using a resin (polymer), the polystyrene equivalent molecular weight (Mw) determined by gel permeation chromatography (GPC) is used as the "molecular weight".

Hereinafter, in the case of merely using the term "resin", it means a resin with a molecular weight of more than 2,000.

The component (A) may be a low molecular weight compound which exhibits changed solubility in an alkali developing solution under action of an acid, a resin which exhibits changed solubility in an alkali developing solution under action of an acid, or a mixture of them.

As the component (A), one kind of organic compound used as a base component for a chemically-amplified resist can be used alone, or two or more of them can be used in combination.

The component (A) in the chemically-amplified resist composition used in the present invention preferably includes a hydrophilic group. By including a hydrophilic group, when a resist pattern is formed using the chemically-amplified resist composition, a coating layer (film) with excellent adhesion can be formed uniformly on the resist pattern. That is, when the component (A) includes a hydrophilic group, the hydrophilic group also exists on the surface of the resist pattern. The hydrophilic group functions, for example, as a functional group (reactive group) to be firmly bonded to a metal oxide film formed on the resist pattern, thereby enabling a coating film with a high density to be formed uniformly on the resist pattern.

The hydrophilic group in the component (A) is preferably at least one selected from the group consisting of a hydroxyl group, a carboxyl group, a carbonyl group (—C(O)—), an ester group (ester linkage; —C(O)—O—), an amino group, and an amide group. Of these, a hydroxyl group (and particularly an alcoholic hydroxyl group or a phenolic hydroxyl group), a carboxyl group, or an ester group is more preferable.

Of these, a carboxyl group, an alcoholic hydroxyl group or a phenolic hydroxyl group is still more preferable, because it enables a coating layer (coating film) to be formed readily on the surface of a resist pattern. Also, it is preferable, because a nano-level pattern with a reduced level of line edge roughness (side wall irregularities of a pattern) can be formed.

The proportion of the hydrophilic group contained in the component (A) affects the amount per unit area of the hydrophilic group which lies on the surface of the resulting resist pattern. Therefore, it can affect the adhesion and density of a coating layer formed on the resist pattern.

In those cases where the component (A) is a low molecular weight compound, each molecule of the low molecular compound preferably includes 1 to 20 equivalents, and more preferably 2 to 10 equivalents, of the hydrophilic group.

Here, the expression "each molecule of the low molecular compound includes 1 to 20 equivalents of the hydrophilic group" means that 1 to 20 hydrophilic groups exist within a single molecule of the compound.

In those cases where the component (A) is a resin, the component (A) preferably contains at least 0.2 equivalents, more preferably within the range of 0.5 to 0.8 equivalents, and still more preferably 0.6 to 0.75 equivalents, of the hydrophilic group. This means that, if the resin consists of a structural unit containing a hydrophilic group and other structural units, then the quantity of the former structural unit is at least 20 mol %, more preferably 50 to 80 mol %, and still more preferably 60 to 75 mol %.

In the present description, the term "structural unit" or "unit" means a monomer unit that contributes to the formation of a resin (polymer).

<Positive Resist Composition>

If the aforementioned chemically-amplified resist composition is a positive resist composition, as the component (A), a base component (A') (hereinafter, referred to as component (A')) is used which has an acid dissociable, dissolution inhibiting group, and exhibits increased solubility in an alkali developing solution under action of an acid.

The positive resist composition is insoluble in an alkali developing solution prior to exposure, and when an acid is generated from the component (B) upon exposure, the acid dissociable, dissolution inhibiting groups are dissociated by the action of the generated acid, and the component (A') becomes soluble in an alkali developing solution. Therefore, in the formation of a resist pattern, when a resist film obtained by applying the positive resist composition on the support (substrate or the like) is subjected to selective exposure, the exposed area becomes soluble in an alkali developing solution, while the unexposed area remains alkali-insoluble, and hence a resist pattern can be formed by a developing treatment with an alkali.

In the positive resist composition, the component (A') preferably contains a hydrophilic group and an acid dissociable, dissolution inhibiting group, and is more preferably the component (A-1) and/or component (A-2) described below.

Here, the hydrophilic group may also act as the acid dissociable, dissolution inhibiting group.

Component (A-1): a resin having a hydrophilic group and an acid dissociable, dissolution inhibiting group.

Component (A-2): a low molecular weight compound having a hydrophilic group and an acid dissociable, dissolution inhibiting group.

Hereinafter, a preferable mode of the components (A-1) and (A-2) will be explained more specifically.

[Component (A-1)]

The component (A-1) is preferably a resin which contains a structural unit having a hydrophilic group and a structural unit having an acid dissociable, dissolution inhibiting group.

The proportion of the structural unit having a hydrophilic group in the resin is preferably within the range of 20 to 80 mol %, more preferably 20 to 70 mol %, and still more preferably 20 to 60 mol %, based on the combined total of all structural units constituting the resin.

The proportion of the structural unit having an acid dissociable, dissolution inhibiting group in the resin is preferably within the range of 20 to 80 mol %, more preferably 20 to 70 mol %, and still more preferably 30 to 60 mol %, based on the combined total of all structural units constituting the resin.

The structural unit having a hydrophilic group is preferably a structural unit having a carboxyl group, an alcoholic hydroxyl group or a phenolic hydroxyl group, and more preferably a structural unit derived from acrylic acid, methacrylic acid, an ($\alpha$-lower alkyl)acrylate ester having an alcoholic hydroxyl group, or a hydroxystyrene.

More specifically, as the component (A-1), a novolak resin having a hydrophilic group and an acid dissociable, dissolution inhibiting group, a hydroxystyrene-based resin, an ($\alpha$-lower alkyl)acrylate ester resin, or a copolymer resin containing a structural unit derived from a hydroxystyrene and a structural unit derived from an ($\alpha$-lower alkyl)acrylate ester are suitably used.

Here, in the present specification, the term "($\alpha$-lower alkyl)acrylic acid" is a generic term that includes either one or both of acrylic acid ($CH_2$=CH—COOH) and an $\alpha$-lower alkylacrylic acid.

The term "$\alpha$-lower alkylacrylic acid" means acrylic acid in which the hydrogen atom which is bonded to the carbon atom bonded to the carbonyl group is substituted with a lower alkyl group.

The term "($\alpha$-lower alkyl)acrylate ester" means an ester derivative of a "($\alpha$-lower alkyl)acrylic acid", and is a generic term that includes either one or both of an acrylate ester and an $\alpha$-lower alkylacrylate ester.

The term "structural unit derived from ($\alpha$-lower alkyl)acrylate ester" means a structural unit that is formed by the cleavage of the ethylenic double bond of an ($\alpha$-lower alkyl)acrylate ester, and is hereinafter also referred to as a ($\alpha$-lower alkyl)acrylate structural unit.

Furthermore, the term "($\alpha$-lower alkyl)acrylate" is a generic term that includes either one or both of an acrylate and an $\alpha$-lower alkylacrylate.

The term "structural unit derived from hydroxystyrene" means a structural unit that is formed by the cleavage of the ethylenic double bond of a hydroxystyrene or an $\alpha$-lower alkylhydroxystyrene, and is hereinafter also referred to as a hydroxystyrene structural unit.

The term "$\alpha$-lower alkylhydroxystyrene" means a hydroxystyrene wherein a lower alkyl group is bonded to the carbon atom which the phenyl group of hydroxystyrene is bonded to.

In "structural unit derived from $\alpha$-lower alkylacrylate ester" and "structural unit derived from $\alpha$-lower alkylhydroxystyrene", lower alkyl groups bonded to the $\alpha$-position are alkyl groups having 1 to 5 carbon atoms, preferably linear or branched alkyl groups, and suitable examples thereof include a methyl group, an ethyl group, a propyl group, an isopropyl group, an n-butyl group, an isobutyl group, a tert-butyl group, a pentyl group, an isopentyl group and a neopentyl group. From an industrial viewpoint, a methyl group is preferable.

There are no particular restrictions on the resin component used as the component (A-1), and suitable examples thereof include a resin component (hereinafter, sometimes referred to as component (A-11)) which includes a structural unit containing a phenolic hydroxyl group such as the structural unit (a1) described below, a structural unit containing an acid dissociable, dissolution inhibiting group such as at least one structural unit selected from the group consisting of the structural unit (a2) and the structural unit (a3) described below, and an alkali-insoluble structural unit such as the structural unit (a4) used if necessary.

In the component (A-11), cleaving is caused in the structural unit (a2) and/or the structural unit (a3) under action of an acid generated from an acid generator upon exposure, and accordingly, a resin which is insoluble in an alkali developing solution prior to exposure has increased solubility in the alkali developing solution. As a result, a chemically-amplified positive resist pattern can be formed through the exposure and development.

Structural Unit (a1)

The structural unit (a1) is a unit having a phenolic hydroxyl group, and preferably a unit derived from a hydroxystyrene represented by the general formula (I) shown below.

[Chemical Formula 1]

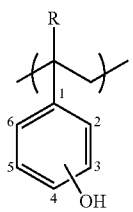

(I)

(In the formula, R represents a hydrogen atom or a lower alkyl group.)

In the above general formula (I), R represents a hydrogen atom or a lower alkyl group, The lower alkyl group for R is the same as the lower alkyl groups which may be bonded to the α-position in the structural unit derived from the α-lower alkylacrylate ester. R is particularly preferably a hydrogen atom or a methyl group. Hereinafter, the explanation of R is the same.

There are no particular restrictions on the binding position of —OH to the benzene ring, and it is preferable to be bonded to the 4-position (para-position) in the above formula.

The quantity of the structural unit (a1) within the component (A-11) is preferably within the range of 40 to 80 mol %, and more preferably 50 to 75 mol %, in terms of forming a pattern. By ensuring that this quantity is at least 40 mol %, the solubility in an alkali developing solution can be improved, and a favorable improvement in the resist pattern shape can also be obtained. By ensuring the quantity is not more than 80 mol % enables a favorable balance to be achieved with the other structural units.

Structural Unit (a2)

The structural unit (a2) is a structural unit having an acid dissociable, dissolution inhibiting group, and is represented by the general formula (II) shown below.

[Chemical Formula 2]

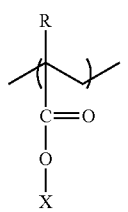

(II)

(In the formula, R is the same as R in the above general formula (I), and X represents an acid dissociable, dissolution inhibiting group.)

In the above general formula (II), X for the acid dissociable, dissolution inhibiting group is an acid dissociable, dissolution inhibiting group which is an alkyl group with a tertiary carbon atom wherein the tertiary carbon atom of the tertiary alkyl group is bonded to an ester group [—C(O)O—]; and a cyclic acetal group such as a tetrahydropyranyl group and a tetrahydrofuranyl group.

As this type of acid dissociable, dissolution inhibiting group, namely the group X, any group typically used within chemically-amplified positive resist compositions, other than the groups described above, can be arbitrarily used.

Preferred examples of the structural unit (a2) include a unit represented by the general formula (III) shown below.

[Chemical Formula 3]

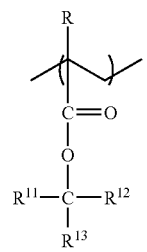

(III)

In the formula, R is the same as R described above in the general formula (I); $R^{11}$, $R^{12}$ and $R^{13}$ each represent, independently, a lower alkyl group (which may be linear or branched, and preferably contains 1 to 5 carbon atoms). Alternatively, of $R^{11}$, $R^{12}$ and $R^{13}$, $R^{11}$ may be a lower alkyl group, and $R^{12}$ and $R^{13}$ may be bonded together to form a monocyclic or polycyclic aliphatic cyclic group. The aliphatic cyclic group preferably contains 5 to 12 carbon atoms.

Here, the expression "aliphatic" means that a group or compound contains no aromaticity, and the term "aliphatic cyclic group" means a monocyclic or polycyclic group containing no aromaticity.

If $R^{11}$, $R^{12}$, and $R^{13}$ do not have aliphatic cyclic groups, for example, all of $R^{11}$, $R^{12}$, $R^{13}$ are preferably methyl groups.

In the case that $R^{12}$ and $R^{13}$ are bonded together to form an aliphatic cyclic group, if the aliphatic cyclic group is a monocyclic aliphatic cyclic group, the structural unit (a2) preferably contains a cyclopentyl group or a cyclohexyl group.

If the above aliphatic cyclic group is a polycyclic aliphatic cyclic group, suitable examples of the structural unit (a2) include a structural unit represented by the general formula (IV) shown below.

[Chemical Formula 4]

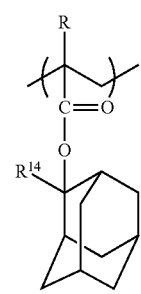

(IV)

(In the formula, R is the same as R in the above general formula (I), and $R^{14}$ represents a lower alkyl group (which may be a linear or branched group, and preferably contains 1 to 5 carbon atoms).)

Also, the structural unit (a2) is preferably a structural unit represented by the general formula (V) shown below, which has an acid dissociable, dissolution inhibiting group which contains a polycyclic aliphatic cyclic group.

[Chemical Formula 5]

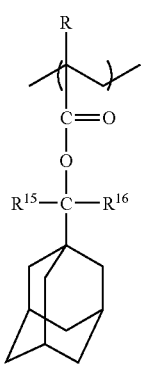

(V)

(In the formula, R is the same as R in the above general formula (I), and $R^{15}$ and $R^{16}$ each independently represents a lower alkyl group (which may be a linear or branched group, and preferably contains 1 to 5 carbon atoms).)

The quantity of the structural unit (a2) within the component (A-11) is preferably within the range of 5 to 50 mol %, more preferably 10 to 40 mol %, and still more preferably 10 to 35 mol %.

Structural Unit (a3)

The structural unit (a3) is a unit having an acid dissociable, dissolution inhibiting group, and is represented by the general formula (VI) shown below.

[Chemical Formula 6]

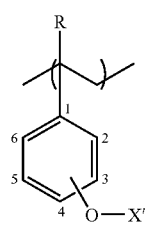

(VI)

(In the formula, R is the same as R in the above general formula (I), and X' represents an acid dissociable, dissolution inhibiting group.)

Specific examples of the acid dissociable, dissolution inhibiting group X' include tertiary alkyloxycarbonyl groups such as a tert-butyloxycarbonyl group and a tert-amyloxycarbonyl group; tertiary alkyloxycarbonylalkyl groups such as a tert-butyloxycarbonylmethyl group and a tert-butyloxycarbonylethyl group; tertiary alkyl groups such as a tert-butyl group and a tert-amyl group; cyclic acetal groups such as a tetrahydropyranyl group and a tetrahydrofuranyl group; and alkoxyalkyl groups such as an ethoxyethyl group and a methoxypropyl group.

Of these groups, a tert-butyloxycarbonyl group, a tert-butyloxycarbonylmethyl group, a tert-butyl group, a tetrahydropyranyl group, or an ethoxyethyl group is preferred.

An acid dissociable, dissolution inhibiting group other than those described above can also be used as an acid dissociable, dissolution inhibiting group X' by appropriately selecting from those used in a chemically-amplified positive resist composition.

In the general formula (VI), there are no restrictions on the binding position of the group (—OX'), which is bonded to the benzene ring, and the 4-position (para-position) shown in the formula is preferable.

The quantity of the structural unit (a3) within the component (A-11) is within the range of 5 to 50 mol %, preferably 10 to 40 mol %, and more preferably 10 to 35 mol %.

Structural Unit (a4)

The structural unit (a4) is a unit which is alkali-insoluble, and is represented by the general formula (VII) shown below.

[Chemical Formula 7]

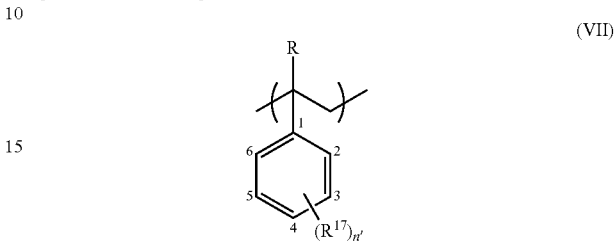

(VII)

(In the formula, R is the same as R in the above general formula (I); $R^{17}$ represents a lower alkyl group, and n' represents either 0 or an integer of 1 to 3.)

Here, the lower alkyl group for $R^{17}$ may be either a linear or a branched chain, and preferably contains 1 to 5 carbon atoms.

n' represents either 0 or an integer of 1 to 3, and is preferably 0.

The quantity of the structural unit (a4) within the component (A-11) is within the range of 1 to 40 mol %, and preferably 5 to 25 mol %. When the quantity is not less than 1 mol %, the level of improvement in the resist shape (and particularly the level of improvement in thickness loss) is enhanced, whereas when the quantity is not more than 40 mol %, a good quantitative balance with the other structural units can be attained.

The component (A-11) contains the aforementioned structural unit (a1) and at least one selected from the group consisting of the structural unit (a2) and (a3), and also may optionally contain the structural unit (a4). Also, as the component (A-1), the copolymer having all of these structural units, or a mixture of the polymers which have one or more of these structural units may be used. Also, these may be used in combination.

Furthermore, the component (A-11) may also include units other than the structural units (a1), (a2), (a3) and (a4) described above, although the structural units (a1), (a2), (a3) and (a4) preferably account for at least 80 mol %, more preferably at least 90 mol %, and most preferably 100 mol % of the component (A-11).

As the component (A-11), the use of "a single copolymer containing the structural units (a1) and (a3), or a mixture of two or more kinds of the copolymers containing the structural units (a1) and (a3)", or "a single copolymer containing the structural units (a1), (a2) and (a4), or a mixture of two or more kinds of the copolymers containing the structural units (a1), (a2) and (a4)", or a mixture of these two configurations offers a simple way of achieving the desired effects, and is therefore the most desirable. Furthermore, such configurations are also preferred in terms of the improvement in heat resistance.

A mixture of a polyhydroxystyrene protected with tertiary alkyloxycarbonyl groups and a polyhydroxystyrene protected with 1-alkoxyalkyl groups is particularly desirable. When mixing these two components, the mixing ratio (weight ratio) between the two polymers (namely, polyhydroxystyrene protected with tertiary alkyloxycarbonyl groups/polyhydroxystyrene protected with 1-alkoxyalkyl groups) is typically within the range of 1/9 to 9/1, preferably 2/8 to 8/2, and more preferably 2/8 to 5/5.

As a resin component other than the aforementioned component (A-11) suitable for the component (A-1), a resin component ((α-lower alkyl)acrylate ester resin component) containing an (α-lower alkyl)acrylate ester resin is preferable, and a resin component consisting of an (α-lower alkyl)acrylate ester is more preferable.

As the (α-lower alkyl)acrylate ester resins, a resin component (hereinafter, sometimes referred to as component (A-12)) containing the structural unit (a5) derived from an (α-lower alkyl)acrylate ester having an acid dissociable, dissolution inhibiting group is preferable. Here, the α-lower alkyl group is the same as defined above.

The acid dissociable, dissolution inhibiting group in the structural unit (a5) is a group which has an alkali dissolution-inhibiting property where the entire component (A-12) is kept alkali-insoluble before exposure, and also has the property where the component (A-12) changes to be alkali-soluble after exposure, since the acid dissociable, dissolution inhibiting group is dissociated from the component (A-12) under action of the acid generated from the component (B).

Also, in the (α-lower alkyl)acrylate ester resin component, when the acid dissociable, dissolution inhibiting group in the structural unit (a5) dissociates under action of the acid generated from the component (B), a carboxyl group is generated.

The carboxyl group thus generated improves adhesion with a coating layer formed on the resist pattern.

As the acid dissociable, dissolution inhibiting group, for example, any of the multitude of groups that have been proposed for resins used within resist compositions designed for use with ArF excimer lasers can be used. Typically, cyclic or chain-like alkoxyalkyl groups, and groups which form cyclic or chain-like tertiary alkyl esters with the carboxyl groups of (α-lower alkyl)acrylic acids are broadly known.

Here, the term "a group which forms a tertiary alkyl ester" means a group which forms an ester by being substituted for the hydrogen atom in the carboxyl group of acrylic acid. That is, it means a structure where a tertiary carbon atom of a chain-like or cyclic tertiary alkyl group is bonded to the oxygen atom at the terminal of a carbonyloxy group [—C(O)—O—] of an acrylate ester. In the tertiary alkyl ester, the bond of the oxygen atom to the tertiary carbon atom is cleaved under action of an acid.

Here, the term "a tertiary alkyl group" means an alkyl group having a tertiary carbon atom.

Examples of a group which forms a chain-like tertiary alkyl ester include a tert-butyl group and a tert-amyl group.

Examples of a group which forms a cyclic tertiary alkyl ester include the same as those described below in "an acid dissociable, dissolution inhibiting group which has an aliphatic cyclic group."

"A cyclic or chain-like alkoxyalkyl group" forms an ester by being substituted for a hydrogen atom of a carboxyl group. That is, it forms the structure where the alkoxyalkyl group is bonded to the oxygen atom at the terminal of a carbonyloxy group [—C(O)—O—] of an acrylate ester. In the structure, the bond of the oxygen atom to the alkoxyalkyl group is cleaved under action of an acid.

Examples of the cyclic or chain-like alkoxyalkyl group include a 1-methoxymethyl group, a 1-ethoxyethyl group, a 1-isopropoxyethyl group, a 1-cyclohexyloxyethyl group, a 2-adamantoxymethyl group, a 1-methyladamantoxymethyl group, a 4-oxo-2-adamantoxymethyl group, a 1-adamantoxyethyl group, and a 2-adamantoxyethyl group.

As the structural unit (a5), a structural unit having an acid dissociable, dissolution inhibiting group which has a cyclic group, particularly an aliphatic cyclic group, is preferred.

Here, the terms "aliphatic" and "aliphatic cyclic group" are as defined above.

The aliphatic cyclic group may be either monocyclic or polycyclic, and can be selected appropriately from the multitude of these types of groups that have been proposed for use with ArF resists. From the viewpoint of ensuring favorable etching resistance, a polycyclic alicyclic group is preferred. Furthermore, the alicyclic group is preferably a hydrocarbon group, and is still more preferably a saturated hydrocarbon group (alicyclic group).

Examples of suitable monocyclic alicyclic groups include groups in which one hydrogen atom has been removed from a cycloalkane. Examples of suitable polycyclic alicyclic groups include groups in which one hydrogen atom has been removed from a polycycloalkane such as a bicycloalkane, a tricycloalkane or a tetracycloalkane.

Specific examples of monocyclic alicylic groups include a cyclopentyl group and a cyclohexyl group. Specific examples of polycyclic alicyclic groups include groups in which one hydrogen atom has been removed from a polycycloalkane such as adamantane, norbornane, isobornane, tricyclodecane or tetracyclododecane.

Of these groups, an adamantyl group in which one hydrogen atom has been removed from adamantane, a norbornyl group in which one hydrogen atom has been removed from norbornane, a tricyclodecanyl group in which one hydrogen atom has been removed from tricyclodecane, or a tetracyclododecanyl group in which one hydrogen atom has been removed from tetracyclododecane is preferred industrially.

More specifically, the structural unit (a5) is preferably at least one unit selected from the group consisting of general formulae (I') to (III') shown below.

Also, it is preferably a structural unit derived from an (α-lower alkyl)acrylate ester which has a cyclic alkoxyalkyl group described above in the ester moiety, and specifically, it is preferably at least one unit selected from the group consisting of structural units derived from aliphatic polycyclic alkyloxy lower alkyl (α-lower alkyl)acrylate esters which may have a substituent, such as a 2-adamantoxymethyl group, a 1-methyl adamantoxymethyl group, a 4-oxo-2-adamantoxymethyl group, a 1-adamantoxyethyl group, and a 2-adamantoxyethyl group.

[Chemical Formula 8]

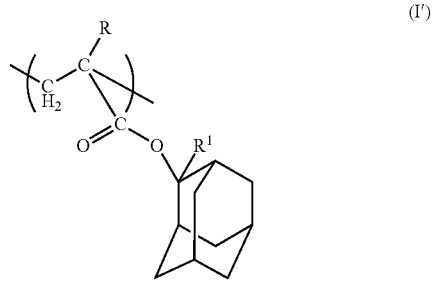

(I')

(In the formula (I'), R is the same as R in the above general formula (I); and $R^1$ represents a lower alkyl group.)

[Chemical Formula 9]

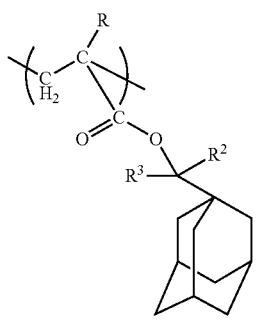

(II')

(In the formula (II'), R is the same as R in the above general formula (I); and $R^2$ and $R^3$ each independently represents a lower alkyl group.)

[Chemical Formula 10]

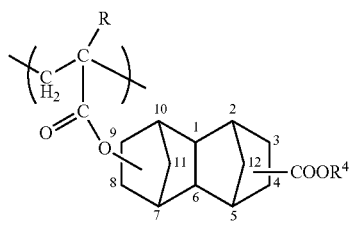

(III')

(In the formula (III'), R is the same as R in the above general formula (I); and $R^4$ represents a tertiary alkyl group.)

In the formulae (I') to (III'), the hydrogen atom or lower alkyl group for R is the same as those described above in the explanation of the hydrogen atom or lower alkyl groups bonded to the α-position of acrylate esters.

As the lower alkyl group for a linear or branched alkyl group having 1 to 5 carbon atoms is preferable, and specific examples thereof include a methyl group, an ethyl group, a propyl group, an isopropyl group, an n-butyl group, an isobutyl group, a pentyl group, an isopentyl group and a neopentyl group. Of these groups, a methyl group or an ethyl group is preferable, because it is easily available industrially.

It is preferable that the lower alkyl groups for $R^2$ and $R^3$ each are independently a linear or branched alkyl group of 1 to 5 carbon atoms. Of these groups, both of $R^2$ and $R^3$ are preferably methyl groups, from an industrial viewpoint. Specific examples of the general formula (II') include a structural unit derived from 2-(1-adamantyl)-2-propyl acrylate.

$R^4$ represents a chain-like tertiary alkyl group or a cyclic tertiary alkyl group. Examples of the chain-like tertiary alkyl group include a tert-butyl group and a tert-amyl group, and of these, a tert-butyl group is industrially preferable.

The cyclic tertiary alkyl group is the same as those described above in "an acid dissociable, dissolution inhibiting group which has an aliphatic cyclic group", and examples thereof include a 2-methyl-2-adamantyl group, a 2-ethyl-2-adamantyl group, a 2-(1-adamantyl)-2-propyl group, a 1-ethylcyclohexyl group, a 1-ethylcyclopentyl group, a 1-methylcyclohexyl group and a 1-methylcyclopentyl group.

Here, the group —$COOR^4$ may be bonded to the 3- or 4-position of the tetracyclododecanyl group shown in the above formula, but the binding position cannot be identified.

Similarly, the carboxyl group of the acrylate structural unit may be bonded to the 8- or 9-position shown in the formula.

As the structural unit (a5), one type can be used alone, or two or more types can be used in combination.

The proportion of the structural unit (a5) within the (α-lower alkyl)acrylate ester resin component is preferably within the range of 20 to 60 mol %, more preferably 30 to 50 mol %, and most preferably 35 to 45 mol %, based on the total of all structural units which constitute the (α-lower alkyl) acrylate ester resin component. When this proportion is not less than the lower limit within the above range, then a satisfactory pattern can be obtained, whereas when the proportion is not more than the upper limit within the above range, a good quantitative balance with the other structural units can be attained.

The (α-lower alkyl)acrylate ester resin preferably further includes a structural unit (a6) derived from an (α-lower alkyl) acrylate ester that contains a lactone-containing group, in addition to the aforementioned structural unit (a5). The structural unit (a6) is effective so as to improve the adhesion between the resist film and the support (substrate or the like), and to improve hydrophilicity with the developing solution. Also, a coating layer having high adhesion with the resist pattern can be formed.

In the structural unit (a6), a lower alkyl group or a hydrogen atom is bonded to the carbon atom at the α-position. The lower alkyl group bonded to the carbon atom at the α-position is the same as those described above in the explanation of the structural unit (a5), and of these, a methyl group is preferable.

Examples of the structural unit (a6) include structural units wherein a monocyclic group composed of a lactone ring, or a polycyclic group containing a lactone ring is bonded to the ester side-chain portion of an acrylate ester.

Here, the term "lactone ring" means a single ring containing a —O—C(O)— structure, and this ring is counted as the first ring. Accordingly, the case in which the only ring structure is the lactone is referred to as a monocyclic group, and groups containing other ring structures are described as a polycyclic group regardless of the structure of the other rings.

Examples of the structural unit (a6) include monocyclic groups in which one hydrogen atom has been removed from γ-butyrolactone, and polycyclic groups in which one hydrogen atom has been removed from a lactone ring-containing bicycloalkane.

More specifically, the structural unit (a6) is preferably at least one selected from the group consisting of general formulae (IV') to (VII') shown below,

[Chemical Formula 11]

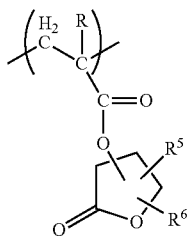

(In the formula (IV'), R is the same as R in the above general formula (I); and $R^5$ and $R^6$ each independently represents a hydrogen atom or a lower alkyl group.)

[Chemical Formula 12]

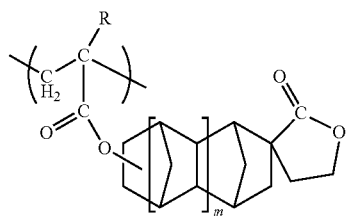

(V')

(In the formula (V'), R is the same as R in the above general formula (I); and m represents 0 or 1.)

[Chemical Formula 13]

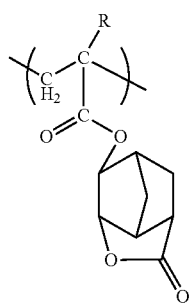

(VI')

(In the formula (VI'), R is the same as R in the above general formula (I).)

[Chemical Formula 14]

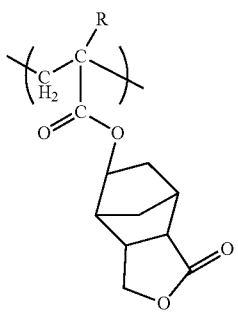

(VII')

(In the formula (VII'), R is the same as R in the above general formula (I).)

In the formula (IV'), $R^5$ and $R^6$ each represent, independently, a hydrogen atom or a lower alkyl group, and preferably a hydrogen atom. The lower alkyl group for $R^5$ and $R^6$ is preferably a linear or branched alkyl group of 1 to 5 carbon atoms, and specific examples thereof include a methyl group, an ethyl group, a propyl group, an isopropyl group, an n-butyl group, an isobutyl group, a tert-butyl group, a pentyl group, an isopentyl group and a neopentyl group. From an industrial viewpoint, a methyl group is preferable.

Of the structural units represented by the general formulae (IV') to (VII'), a structural unit represented by the general formula (IV') is preferable because of the inexpensive price and industrial reasons. Of the structural units represented by the general formula (IV'), it is most preferable that R be a methyl group, both of $R^5$ and $R^6$ be hydrogen atoms, and the position of the ester bond between the methacrylate ester and γ-butyrolactone is the α-position of the lactone ring, that is, α-methacryloyloxy-γ-butyrolactone.

As the structural unit (a6), one type can be used alone, or two or more types can be used in combination.

The proportion of the structural unit (a6) within the (α-lower alkyl)acrylate ester resin component is preferably within the range of 20 to 60 mol %, more preferably 20 to 50 mol %, and most preferably 30 to 45 mol %, based on the total of all structural units which constitute the (α-lower alkyl) acrylate ester resin component. When this proportion is not less than the lower limit of the above range, the lithography characteristics can be improved. On the other hand, when this proportion is not more than the upper limit, a good quantitative balance with the other structural units can be attained.

The (α-lower alkyl)acrylate ester resin component preferably further includes the structural unit (a7) derived from an acrylate ester that contains a polar group-containing polycyclic group, in addition to the structural unit (a5), or the structural units (a5) and (a6).

By including the structural unit (a7), hydrophilicity of the entire (α-lower alkyl)acrylate ester resin component is enhanced, compatibility with the developing solution is enhanced, and solubility of the exposed portions of the resist in an alkali developing solution is improved. Therefore, the structural unit (a7) contributes to the improvement in resolution. Furthermore, a coating layer having high adhesion with the resist pattern can be formed.

In the structural unit (a7), a lower alkyl group or a hydrogen atom is bonded to the carbon atom at the α-position of the structural unit (a7). The lower alkyl group bonded to the carbon atom at the α-position is the same as those described above in the explanation of the structural unit (a5), and of these, a methyl group is preferable.

Examples of the polar group include a hydroxyl group, a cyano group, a carboxyl group and an amino group, and of these, a hydroxyl group is particularly preferable.

As the polycyclic group, any polycyclic group selected appropriately from the polycyclic groups included in the aliphatic cyclic groups described above in "an acid dissociable, dissolution inhibiting group which has an aliphatic cyclic group" of the structural unit (a5) can be used.

As the structural unit (a7), at least one selected from general formulae (VIII') to (IX') shown below is preferable.

[Chemical Formula 15]

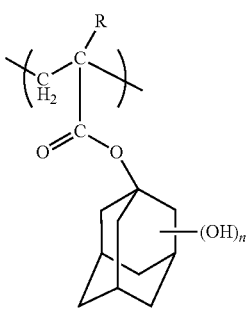

(VIII')

(In the formula (VIII'), R is the same as R in the above general formula (I); and n represents an integer of 1 to 3.)

In the formula (VIII'), R is the same as R described above in the general formula (I).

Of these, it is preferable that n be 1, and the hydroxyl group be bonded to the 3-position of the adamantyl group.

[Chemical Formula 16]

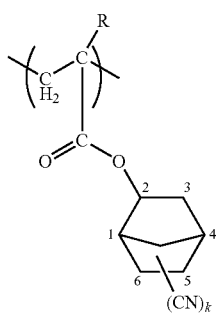

(IX')

(In the formula (IX'), R is the same as R in the above general formula (I); and k represents an integer of 1 to 3.)

Of these, k is preferably 1. Also, it is preferable that the cyano group be bonded to the 5-position or 6-position of the norbornyl group.

As the structural unit (a7), one type can be used alone, or two or more types can be used in combination.

The proportion of the structural unit (a7) within the (α-lower alkyl)acrylate ester resin component is preferably within the range of 10 to 50 mol %, more preferably 15 to 40 mol %, and still more preferably 20 to 35 mol %, based on the total of all structural units which constitute the (α-lower alkyl)acrylate ester resin component. When this proportion is not less than the lower limit of the above range, the lithography characteristics can be improved. On the other hand, when this proportion is not more than the upper limit, a good quantitative balance with the other structural units can be attained.

The proportion of total of the structural units (a5) to (a7) within the (α-lower alkyl)acrylate ester resin component is preferably within the range of 70 to 100 mol %, and more preferably 80 to 100 mol %, based on the total of all structural units which constitute the (α-lower alkyl)acrylate ester resin component.

The (α-lower alkyl)acrylate ester resin component may include the structural unit (a8) other than the structural units (a5) to (a7) described above.

There are no restrictions on the structural unit (a8), as long as it is a structural unit which is not classified in the structural units (a5) to (a7).

Preferable examples of the structural unit (a8) include structural units which contain a polycyclic aliphatic hydrocarbon group and which are derived from an (α-lower alkyl) acrylate ester. As the polycyclic aliphatic hydrocarbon groups, for example, any polycyclic aliphatic hydrocarbon group appropriately selected from the polycyclic groups included in the aliphatic cyclic groups described above in "an acid dissociable, dissolution inhibiting group which has an aliphatic cyclic group" can be used. Particularly, at least one selected from a tricyclodecanyl group, an adamantyl group, a tetracyclododecanyl group, a norbornyl group and an isobornyl group is preferable from the viewpoint of industrial availability. The structural unit (a8) is most preferably a non-acid dissociable group.

Specific examples of the structural unit (a8) include structural units of the general formulae (X) to (XII) shown below.

[Chemical Formula 17]

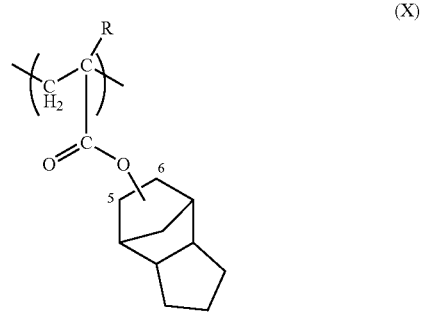

(X)

(In the formula, R is the same as R in the above general formula (I).)

[Chemical Formula 18]

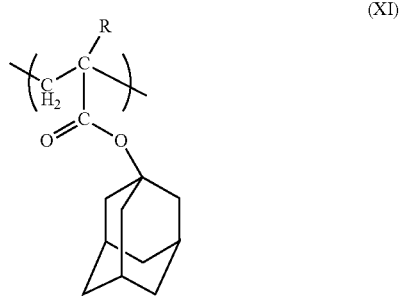

(XI)

(In the formula, R is the same as R in the above general formula (I).)

[Chemical Formula 19]

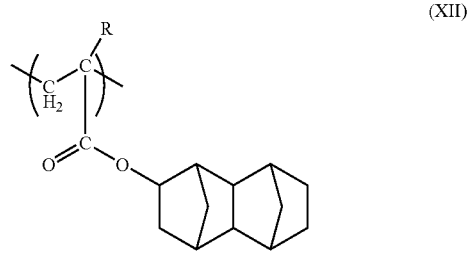

(XII)

(In the formula, R is the same as R in the above general formula (I).)

If the structural unit (a8) is contained, the proportion of the structural unit (a8) within the (α-lower alkyl)acrylate ester resin component is preferably within the range of 1 to 25 mol %, and more preferably 5 to 20 mol %, based on the total of all structural units which constitute the α-lower alkyl)acrylate ester resin component.

The (α-lower alkyl)acrylate ester resin component is preferably a copolymer that contains at least the structural units (a5), (a6) and (a7), Examples of the copolymer include a copolymer composed of the structural units (a5), (a6) and (a7); and a copolymer composed of the structural units (a5), (a6), (a7) and (a8).

The component (A-1) can be obtained by a conventional polymerization of the monomers corresponding to each of the structural units. For example, the component (A-1) can be obtained by a conventional radical polymerization or the like of the monomers corresponding to each of the structural units, using a radical polymerization initiator such as azobisisobutyronitrile (AIBN).

The weight average molecular weight (Mw; the polystyrene equivalent value determined by gel permeation chromatography: hereinafter, referred to as the same) of the component (A-1) is preferably 30,000 or less, more preferably 20,000 or less, and still more preferably 12,000 or less. The lower limit is typically more than 2,000, and from the viewpoint of inhibiting pattern collapse and improving resolution, it is preferably not less than 4,000, and more preferably not less than 5,000.

Further, there are no particular restrictions on the dispersity (Mw/Mn), although it is preferably within the range of 1.0 to 5.0, more preferably 1.0 to 3.0, and most preferably 1.2 to 2.5. Herein, Mn means the number average molecular weight.

[Component (A-2)]

The component (A-2) is preferably a low molecular weight compound which has a molecular weight of 500 to 2,000, contains a hydrophilic group, and also contains the acid dissociable, dissolution inhibiting group X or X' as described above in the component (A-1). Specific examples thereof include a compound containing a plurality of phenol skeletons wherein a part of the hydrogen atoms of the hydroxyl groups within the compound have been substituted with the aforementioned acid dissociable, dissolution inhibiting group X or X'.

Preferable examples of the component (A-2) include compounds wherein a portion of the hydrogen atoms of the hydroxyl groups within low molecular weight phenol compounds known as sensitizers or heat resistance improvement agents within non-chemically-amplified g-line and i-line resists have been substituted with the aforementioned acid dissociable, dissolution inhibiting group, and any of these compounds can be used arbitrarily.

Examples of these low molecular weight phenol compounds include the following:

Namely, examples include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers and tetramers of formaldehyde condensation products of phenols such as phenol, m-cresol, p-cresol and xylenol. Of course, the low molecular weight phenol compounds are not restricted to these examples.

There are no particular restrictions on the acid dissociable, dissolution inhibiting group, and suitable examples include the groups described above.

[Component (B)]

As the component (B), any of the compounds appropriately selected from conventional acid generators for use within chemically-amplified resists can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

Specific examples of onium salt-based acid generators include diphenyliodonium trifluoromethanesulfonate, (4-methoxyphenyl)phenyliodonium trifluoromethanesulfonate, bis(p-tert-butylphenyl)iodonium trifluoromethanesulfonate, triphenylsulfonium trifluoromethanesulfonate, (4-methoxyphenyl)diphenylsulfonium trifluoromethanesulfonate, (4-methylphenyl)diphenylsulfonium nonafluorobutanesulfonate, (p-tert-butylphenyl)diphenylsulfonium trifluoromethanesulfonate, diphenyliodonium nonafluorobutanesulfonate, bis(p-tert-butylphenyl)iodonium nonafluorobutanesulfonate, and triphenylsulfonium nonafluorobutanesulfonate. Of these compounds, onium salts containing a fluorinated alkylsulfonate ion as the anion are preferred.

Examples of suitable oxime sulfonate compounds include α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile, and α-(methylsulfonyloxyimino)-p-bromophenylacetonitrile. Of these, α-(methylsulfonyloxyimino)-p-methoxyphenylacetonitrile is preferred.

Specific examples of suitable diazomethane-based acid generators include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

As the component (B), either a single acid generator may be used alone, or two or more different acid generators may be used in combination.

The quantity of the component (B) used is typically within the range of 1 to 20 parts by weight, and preferably 2 to 10 parts by weight, relative to 100 parts by weight of the component (A'). If this quantity is not less than the lower limit in the above range, then pattern formation is conducted satisfactorily, whereas if the quantity is not more than the upper limit in the above range, it can be easy to achieve a uniform solution, and obtain the excellent storage stability of the composition.

[Optional Components]

In order to improve the resist pattern shape and the post exposure stability of the latent image formed by the patternwise exposure of the resist layer, a nitrogen-containing organic compound (D) (hereinafter, referred to as component (D)) can also be added to the resist composition as an optional component.

Since a multitude of these components (D) have already been proposed, any of these known compounds can be used. Of these, an amine, particularly a secondary lower aliphatic amine or tertiary lower aliphatic amine is preferred.

Here, a lower aliphatic amine means an alkyl or alkyl alcohol amine of not more than 5 carbon atoms, and examples of these secondary or tertiary amines include trimethylamine, diethylamine, triethylamine, di-n-propylamine, tri-n-propylamine, tripentylamine, diethanolamine, triethanolamine, and triisopropanolamine. Of these, tertiary alkanolamines such as triethanolamine or triisopropanolamine are particularly preferred.

These may be used either alone, or in combination of two or more different compounds.

The component (D) is typically used in a quantity within the range of 0.01 to 5.0 parts by weight, relative to 100 parts by weight of the component (A").

In the positive resist composition, in order to prevent any deterioration in sensitivity caused by the addition of the component (D), and improve the resist pattern shape and the post exposure stability of the latent image formed by the patternwise exposure of the resist layer, organic carboxylic acids and phosphorus oxo acids or derivatives thereof (E) (hereinafter, referred to as component (E)) may also be added as an optional component. The component (D) and the component (E) can be used in combination, or either one can also be used alone.

Suitable examples of organic carboxylic acids include malonic acid, citric acid, malic acid, succinic acid, benzoic acid, and salicylic acid.

Suitable examples of phosphorus oxo acids or derivatives thereof include phosphoric acid or derivatives thereof such as esters, including phosphoric acid, di-n-butyl phosphate, and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid. Of these, phosphonic acid is particularly preferred.

The component (E) is used in a quantity within the range of 0.01 to 5.0 parts by weight, relative to 100 parts by weight of the component (A').

In the positive resist composition, if desired, additives having miscibility, for example, additive resins for improving performance of a resist film, surfactants for improving coatability, dissolution inhibitors, plasticizers, stabilizers, colorants, and antihalation agents can be appropriately added.

The positive resist composition can be manufactured by dissolving the materials in an organic solvent (5).

The component (S) may be an organic solvent which can dissolve the respective components used in the present invention to give a uniform solution, and one kind, or two or more kinds of organic solvents can be used, appropriately selected from those which have been conventionally known as a solvent for a resist composition.

Specific examples of the solvent include lactones such as γ-butyrolactone; ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, propylene glycol monomethyl ether acetate (PGMEA), dipropylene glycol, and dipropylene glycol monoacetate, and a monomethyl ether, monoethyl ether, monopropyl ether, monobutyl ether or monophenyl ether thereof; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate. Of these, PGMEA, EL, or propylene glycol monomethyl ether (PGME) is preferable.

These organic solvents may be used either alone, or may be used as a mixed solvent of two or more different solvents.

There are no particular restrictions on the amount of the component (S) used, and the component (S) is used within the quantity where the positive resist composition is a liquid with the concentration enough to be applied on a support.

<Negative Resist Composition>

If the aforementioned chemically-amplified resist composition is a negative resist composition, an alkali-soluble resin component (A") (hereinafter, referred to as component (A")) is typically used as the component (A).

In the present invention, the negative resist composition is preferably a resist composition produced by dissolving an alkali-soluble resin component (A"), an acid generator component (B) which generates an acid upon exposure, and a cross-linking agent component (C) (hereinafter, referred to as component (C)) in an organic solvent (S") described below.

In the negative resist composition, when an acid is generated from the component (B) upon exposure, the action of this acid causes a cross-linking reaction between the component (A") and the component (C), and the component (A") becomes insoluble in an alkali developing solution. Therefore, in the formation of a resist pattern, when a resist film obtained by applying the negative resist composition on a support (substrate or the like) is subjected to selective exposure, the exposed area becomes insoluble in an alkali developing solution, while the unexposed area remains alkali-soluble, and hence a resist pattern can be formed by a developing treatment with an alkali.

In the negative resist composition, the component (A") is preferably an alkali-soluble resin that contains a fluorinated hydroxyalkyl group, represented by the general formula (a1-1-1) shown below.

Suitable examples of the component (A") include those which contain a copolymer (A1) containing: a structural unit (a1") which contains an aliphatic cyclic group containing a fluorinated hydroxyalkyl group within the main chain thereof; and a structural unit (a2") which contains a hydroxyalkyl group.

Also, suitable examples of the component (A") include those which contain a copolymer (A2) containing: a structural unit (a21) which contains an aliphatic cyclic group containing a fluorinated hydroxyalkyl group; a structural unit (a22) derived from an acrylate ester containing a hydroxyl group-containing aliphatic cyclic group; and preferably further containing a structural unit (a23) derived from an acrylate ester containing an alcoholic hydroxyl group within the side chain thereof and no cyclic structure.

(Copolymer (A1))

In the present invention, the copolymer (A1) includes: the structural unit (a1") (hereinafter, abbreviated as structural unit (a1")) which contains an aliphatic cyclic group containing a fluorinated hydroxyalkyl group within the main chain thereof; and the structural unit (a2") (hereinafter, abbreviated as structural unit (a2")) which contains a hydroxyalkyl group.

Structural Unit (a1")

The copolymer (A1) includes the structural unit (a1") which contains an aliphatic cyclic group containing a fluorinated hydroxyalkyl group within the main chain thereof.

In the structural unit (a1"), the term "an aliphatic cyclic group containing a fluorinated hydroxyalkyl group" means a group in which a fluorinated hydroxyalkyl group is bonded to a carbon atom constituting the ring of the aliphatic cyclic group.

Also, the expression "containing an aliphatic cyclic group within the main chain" means that at least one, preferably two or more, of the carbon atoms on the ring of the aliphatic cyclic group constitutes the main chain of the copolymer (A1).

In the present invention, if the component (A") includes the copolymer (A1) which contains the structural unit (a1"), solubility in an alkali developing solution is enhanced, and lithography properties such as a resist pattern, shape and line width roughness (LWR) are improved. Also, by containing an aliphatic cyclic group (for example, a structure of norbornane or tetracyclododecane) within the main chain, etching resistance is improved due to the increased density of carbon atoms.

Here, the "fluorinated hydroxyalkyl group" is a group in which, in a hydroxyalkyl group in which a part of the hydrogen atoms within an alkyl group is substituted with hydroxyl groups, a part or all of the hydrogen atoms which are not substituted with the hydroxyl group in the above hydroxyalkyl group are substituted with fluorine atoms.

In the fluorinated hydroxyalkyl group, the hydrogen atoms of the hydroxyl groups can be readily released due to the fluorination.

In the fluorinated hydroxyalkyl group, the alkyl group is preferably a linear or branched alkyl group.

There are no particular restrictions on the number of carbon atoms in the alkyl group, and the alkyl group preferably has 1 to 20 carbon atoms, more preferably 4 to 16 carbon atoms, and most preferably 4 to 12 carbon atoms.

There are no particular restrictions on the number of the hydroxyl groups, and the number of the hydroxyl groups is preferably 1.

Of these, the fluorinated hydroxyalkyl group is preferably a group in which a fluorinated alkyl group and/or a fluorine atom is bonded to the carbon atom (herein, it refers to the carbon atom at the α-position of a hydroxyalkyl group) to which a hydroxyl group is bonded.

Here, the fluorinated alkyl group bonded to the α-position is preferably a group in which a part or all of the hydrogen atoms of an alkyl group is substituted with fluorine atoms. Also, the fluorinated alkyl group is preferably a linear or branched alkyl group of 1 to 5 carbon atoms, and more preferably 1 carbon atom.

The term "aliphatic" in "aliphatic cyclic group containing a fluorinated hydroxyalkyl group" is a relative concept used in relation to the term "aromatic", and is defined as a group or compound that contains no aromaticity. An aliphatic cyclic group may be monocyclic or polycyclic.

The term "monocyclic aliphatic cyclic group" means a monocyclic group that contains no aromaticity, whereas the term "polycyclic aliphatic cyclic group" means a polycyclic group that contains no aromaticity.

The aliphatic cyclic group in the structural unit (a1") is preferably polycyclic, because it excels in etching resistance or the like.

Examples of the aliphatic cyclic group include a hydrocarbon group (alicyclic group) consisting of carbon atoms and hydrogen atoms, and a heterocyclic group in which a part of the carbon atoms which constitute a ring of the alicyclic group are substituted with heteroatoms such as oxygen atoms, nitrogen atoms and sulfur atoms. This aliphatic cyclic group may contain a substituent, and examples thereof include an alkyl group of 1 to 5 carbon atoms.

Here, the expression "containing a substituent" means that a part or all of the hydrogen atoms bonded to the carbon atoms which constitute a ring of the aliphatic cyclic group is substituted with substituents (atoms or groups other than hydrogen atoms). In the present invention, the aliphatic cyclic group is preferably a hydrocarbon group (alicyclic group) consisting of carbon atoms and hydrocarbon atoms.

The aliphatic cyclic group may be either saturated or unsaturated, and a saturated aliphatic cyclic group is preferable because it exhibits high transparency relative to an ArF excimer laser or the like, and also excels in resolution, depth of focus (DOF), and the like.

The aliphatic cyclic group preferably has 5 to 15 carbon atoms.

Specific examples of the aliphatic cyclic group include the following.

Examples of the monocyclic group include a group in which two or more hydrogen atoms have been removed from cycloalkane. Specific examples thereof include a group in which two or more hydrogen atoms have been removed from cyclopentane or cyclohexane. Of these, a group in which two or more hydrogen atoms have been removed from cyclohexane is preferable.

Examples of the polycyclic groups include a group in which two or more hydrogen atoms have been removed from a polycycloalkane such as a bicycloalkane, a tricycloalkane, or a tetracycloalkane. Specific examples include groups in which two or more hydrogen atoms have been removed from a polycycloalkane such as adamantine, norbornane, isobornane, tricyclodecane or tetracyclododecane.

These types of aliphatic cyclic groups can be appropriately selected from the multitude of groups proposed within resins for photoresist compositions designed for use with ArF excimer lasers.

Of these, a group in which two or more hydrogen atoms have been removed from cyclohexane, adamantine, norbornane, or tetracyclododecane is preferable in terms of industrial availability.

Of these aliphatic cyclic groups described above, a group in which three hydrogen atoms have been removed from norbornane or tetracyclododecane, such as the structural unit (a1-1) described below, is preferable, and a group in which three hydrogen atoms have been removed from norbornane is particularly preferable.

Preferable examples of those included in the structural unit (a1") include the structural unit (a1-1) represented by the general formula (a1-1) shown below. By including the structural unit (a1-1), solubility in an alkali developing solution is particularly improved. Also, lithography properties such as resolution are improved.

[Chemical Formula 20]

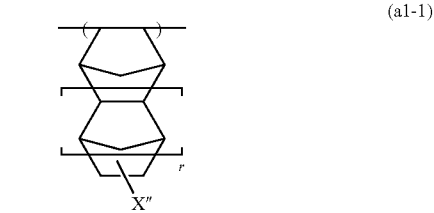

(a1-1)

(In the formula, X" represents a fluorinated hydroxyalkyl group; and r represents an integer of 0 or 1.)

In the above general formula (a1-1), r represents an integer of 0 or 1, and is preferably 0 in terms of industrial availability.

Also in the general formula (a1-1), the "fluorinated hydroxyalkyl group" represented by X" is as defined above and of these, X" is particularly preferably a group represented by the general formula (a1-1-1) shown below. It is preferable because it excels in a resist pattern shape, and reduces the level of line edge roughness (LER).

Her; the term "line edge roughness (LER)" means non-uniform irregularities within the line side walls.

[Chemical Formula 21]

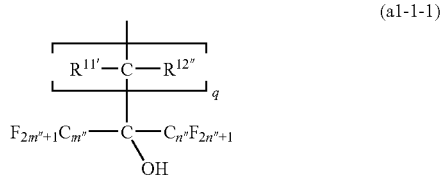

(a1-1-1)

(In the formula, $R^{11\prime\prime}$ and $R^{12\prime\prime}$ each independently represents a hydrogen atom or a lower alkyl group; m" and n" each independently represents an integer of 1 to 5; and q represents an integer of 1 to 5.)

In the above formula (a1-1-1), $R^{11\prime\prime}$ and $R^{12\prime\prime}$ each independently represents a hydrogen atom or a lower alkyl group.

The lower alkyl group is preferably a linear or branched alkyl group of 1 to 5 carbon atoms, and examples thereof include a methyl group, an ethyl group, a propyl group, an isopropyl group, an n-butyl group, an isobutyl group, a tert-butyl group, a pentyl group, an isopentyl group, and a neopentyl group. Of these, a methyl group is preferable.

Of these, both of $R^{11\prime\prime}$ and $R^{12\prime\prime}$ are preferably hydrogen atoms.

q represents an integer of 1 to 5, preferably an integer of 1 to 3, and most preferably 1.

m" and n" each independently represents an integer of 1 to 5, and preferably an integer of 1 to 3. m" and n" are particularly preferably 1, because it excels in terms of the synthesis.

As the structural unit (a1"), one type can be used alone, or two or more types can be used in combination.

The proportion of the structural unit (a1") within the copolymer (A1) is preferably within the range of 50 to 90 mol %, more preferably 55 to 90 mol %, and still more preferably 60 to 80 mol %, based on the combined total of all structural units constituting the copolymer (A1), Ensuring that this amount is at least as large as the lower limit of the above range improves the lithography properties such as a resist pattern shape and LWR (line width roughness) obtained by the inclusion of the structural unit (a1"), whereas ensuring that the proportion is not greater than the upper limit enables a favorable balance to be achieved with the other structural units.

Structural Unit (a2")

The copolymer (A1) includes a structural unit (a2") which contains a hydroxyalkyl group.

In the present invention, if the component (A") includes the copolymer (A1) containing the structural unit (a2"), solubility of the component (A") in an alkali developing solution is improved. Also, the cross-linking ability of the component (A") with the component (C) is enhanced, and hence, the difference (contrast) in the solubility within the alkali developing solution between the exposed portions and the unexposed portions can be increased, enabling the composition to function effectively as a negative resist.

As the structural unit (a2"), a structural unit (a210) which contains an aliphatic cyclic group having a hydroxyalkyl group within the main chain thereof (hereinafter, abbreviated as structural unit (a210)), or a structural unit (a220) derived from an acrylate ester having a hydroxyl group-containing alkyl group (hereinafter, abbreviated as structural unit (a220)) can be suitably used.

As the structural unit (a2"), one type can be used alone, or two or more types can be used in combination.

Structural Unit (a210)

In the present invention, the structural unit (a210) is a structural unit which contains an aliphatic cyclic group having a hydroxyalkyl group within the main chain thereof.

Suitable examples of the structural unit (a210) include the same structural units as those described above for the structural unit (a1"), with the exception that, in the explanation of the "fluorinated hydroxyalkyl group" of the structural unit (a1"), the hydroxyalkyl group is not fluorinated, that is, within the hydroxyalkyl group in which a part of the hydrogen atoms of the alkyl group have been substituted with hydroxyl groups, the other hydrogen atoms which have not been substituted with hydroxyl groups are not substituted with fluorine atoms.

Preferable examples of the structural unit (a210) include a structural unit (a2-1) represented by the general formula (a2-1) shown below. By including the structural unit (a2-1), lithography properties such as a resist pattern shape or line width roughness (LWR) are improved. Also, excellent contrast can be readily obtained, and etching resistance is improved.

[Chemical Formula 22]

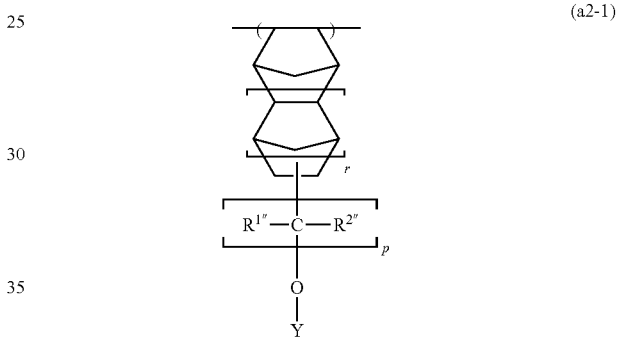

(a2-1)

(In the formula, $R^{1\prime\prime}$ and $R^{2\prime\prime}$ each independently represents a hydrogen atom or a lower alkyl group; Y represents a hydrogen atom or a hydroxyalkyl group; r represents an integer of 0 or 1; and p represents an integer of 1 to 3.)

The structural unit (a2-1) represented by the above general formula (a2-1) is a structural unit which includes a norbornane or tetracyclododecane structure containing a hydroxyalkyl group within the main chain thereof.

In the above formula (a2-1), $R^{1\prime\prime}$ and $R^{2\prime\prime}$ each independently represents a hydrogen atom or a lower alkyl group. Examples of the lower alkyl group for $R^{1\prime\prime}$ and $R^{2\prime\prime}$ include the same lower alkyl groups as those described above for $R^{11\prime\prime}$ and $R^{12\prime\prime}$ in the general formula (a1-1-1). Both of $R^{1\prime\prime}$ and $R^{2\prime\prime}$ are preferably hydrogen atoms.

Y represents a hydrogen atom or a hydroxyalkyl group.

The hydroxyalkyl group for Y is preferably a linear or branched hydroxyalkyl group of 10 or less carbon atoms, more preferably a linear or branched hydroxyalkyl group of 8 or less carbon atoms, and still more preferably a linear hydroxyalkyl group of 1 to 3 carbon atoms.

There are no particular restrictions on the number of hydroxyl groups of the hydroxyalkyl group and on the bonding position thereof. Usually, it is preferable that the number of the hydroxyl groups be 1, and the hydroxyl group be bonded to the terminal of the alkyl group.

Of these, Y is preferably a hydrogen atom.

r represents an integer of 0 or 1, and is preferably 0.

p represents an integer of 1 to 3, preferably 1 or 2, and most preferably 1.

Specific examples of the structural unit (a2-1) include structural units represented by the formulae (a2-1-1) to (a2-1-7) shown below.

[Chemical Formula 23]

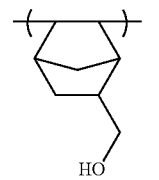
(a2-1-1)

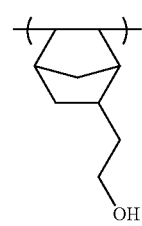
(a2-1-2)

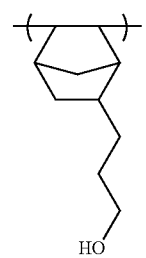
(a2-1-3)

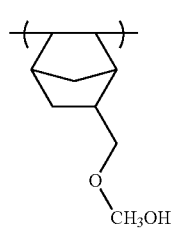
(a2-1-4)

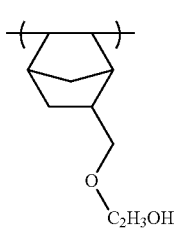
(a2-1-5)

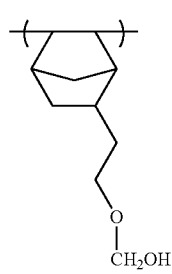
(a2-1-6)

-continued

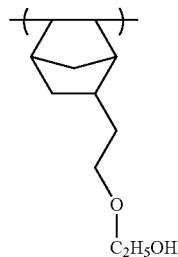
(a2-1-7)

Of these, a structural unit represented by the formulae (a2-1-1), (a2-1-2), or (a2-1-3) is preferable.

As the structural unit (a210), one type can be used alone, or two or more types can be used in combination.

The proportion of the structural unit (a210) within the copolymer (A1) is preferably within the range of 10 to 50 mol %, more preferably 15 to 50 mol %, and still more preferably 20 to 45 mol %, based on the combined total of all structural units constituting the copolymer (A1). Ensuring that this amount is at least as large as the lower limit of the above range improves the effects of improving solubility in an alkali developing solution, enabling satisfactory contrast to be readily obtained, or the like, which are obtained by including the structural unit (a2"). On the other hand, ensuring that the proportion is not greater than the upper limit enables a favorable balance to be achieved with the other structural units.

Structural Unit (a220)

The structural unit (a220) is a structural unit derived from an acrylate ester having a hydroxyl group-containing alkyl group.

If the structural unit (a220) is a structural unit (hereinafter, abbreviated as structural unit (a221)) which contains a cyclic alkyl group containing a hydroxyl group, the effect of suppressing the swelling of the resultant resist pattern can be enhanced. Also resolution is improved. Furthermore, satisfactory contrast and etching resistance can be obtained more readily.

As the structural unit (a221), for example, among the structural units described below in the explanation of "the structural unit (a22) derived from an acrylate ester containing a hydroxyl group-containing aliphatic cyclic group" that constitutes the copolymer (A2), those in which the aliphatic cyclic group is a saturated hydrocarbon group can be used. Of these, those in which the substituent bonded to the α-position of the acrylate ester is a fluorine atom or a fluorinated alkyl group are preferable, those hi which the substituent is a fluorinated alkyl group of 1 to 5 carbon atoms are more preferable, and those in which the substituent is a trifluoromethyl group (—$CF_3$) are most preferable.

Also, if the structural unit (a220) is a structural unit (hereinafter, abbreviated as structural unit (a222)) which contains a chain-like alkyl group containing a hydroxyl group, the entire component (A") increases the hydrophilicity, thereby enhancing solubility in an alkali developing solution, and improving resolution. Also, in a resist pattern formation, cross-linking reaction can be satisfactorily controlled, and the resultant pattern shape and resolution are improved. Furthermore, film density tends to be increased, and accordingly, film thickness loss can be suppressed in an etching process, and also heat resistance tends to be improved.

As the structural unit (a222), for example, among the structural units described below in the explanation of "the structural unit (a23) derived from an acrylate ester containing an alcoholic hydroxyl group within the side chain thereof and no cyclic structure" which constitutes the copolymer (A2), those which contain a hydroxyalkyl group can be used. Of these, structural units in which a hydroxyalkyl group is included in the ester moiety of the acrylate ester are preferable. Of these, those in which the substituent bonded to the α-position of the acrylate ester is a fluorine atom or a fluorinated alkyl group are preferable, those in which the substituent is a fluorinated alkyl group of 1 to 5 carbon atoms are more preferable, and those in which the substituent is a trifluoromethyl group (—$CF_3$) are most preferable.

As the structural unit (a220), one type can be used alone, or two or more types can be used in combination.

The proportion of the structural unit (a220) within the copolymer (A1) is preferably within the range of 10 to 80 mol %, more preferably 15 to 60 mol %, and still more preferably 20 to 55 mol %, based on the combined total of all structural units constituting the copolymer (A1). Ensuring that this proportion is at least as large as the lower limit of the above range enables the effects due to the inclusion of the structural unit (a220) to be obtained, whereas ensuring that the proportion is not greater than the upper limit enables a favorable balance to be achieved with the other structural units.

Here, if the structural unit (a220) includes both of the aforementioned structural units (a221) and (a222), the mixed proportion of these structural units is preferably within the range of 9:1 to 1:9 (structural unit (a221):structural unit (a222)), more preferably 8:2 to 2:8, and still more preferably 6:4 to 7:3.

When the structural units (a221) and (a222) are blended within the above mixed proportion, excellent EL margin (exposure margin) can be obtained. Also, adequate contrast can be obtained, and resolution is improved. Furthermore, etching resistance is improved.

Other Structural Unit

In the negative resist composition used in the present invention, as a structural unit other than the aforementioned structural units (a1") and (a2"), the component (A") can arbitrarily include a structural unit that has been used in a conventional alkali-soluble resin component for a chemically-amplified resist composition.

In this regard, however, in the present invention, the copolymer (A1) is preferably a resin which contains the structural units (a1") and (a2") as main components.

Here, the expression "main components" means that the total amount of the structural units (a1") and (a2") is 70 mol % or more, and is preferably 60 mol % or more. Of these, it is preferable that the copolymer (A1) be a copolymer in which the total amount of the structural units (a1") and (a2") is 100 mol %.

In the present invention, as a combination of the structural units (a1") and (a2") in the copolymer (A1), a combination of the structural unit (a1") and the structural unit (a210) is preferable. As examples of such a combination, those represented by the formulae (A1-1) to (A1-4) shown below can be mentioned.

[Chemical Formula 24]

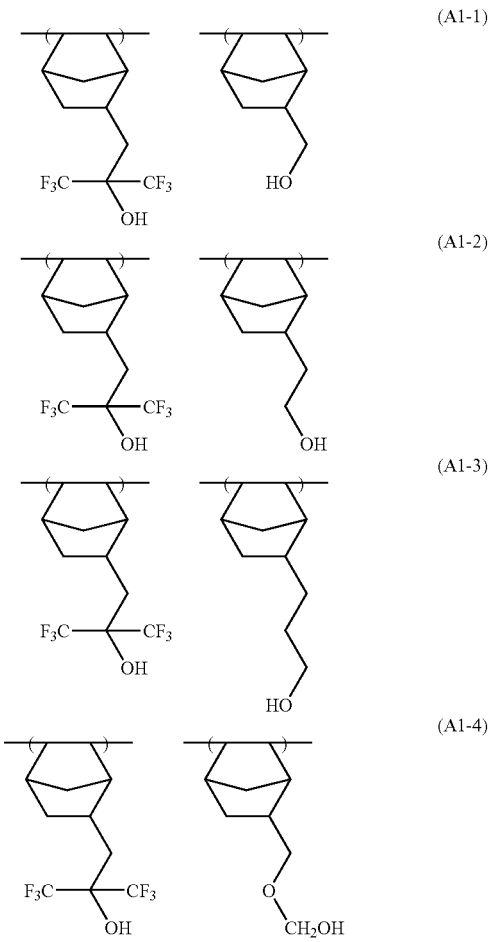

In the present invention, the weight average molecular weight (Mw; the polystyrene equivalent value determined by gel permeation chromatography) of the copolymer (A1) is preferably within the range of 2,000 to 10,000, more preferably 3,000 to 6,000, and still more preferably 3,000 to 5,000. Ensuring that this amount is at least as large as the lower limit of the above range enables satisfactory contrast to be obtained, whereas ensuring that the proportion is not greater than the upper limit enables a resist pattern with minimal swelling. As a result, the resolution is improved. Also, since swelling of a resist pattern can be suppressed, the effects of improving a depth of focus (DOF) property and suppressing the level of line edge roughness (LER) can be achieved. Also, it is preferable that the weight average molecular weight be within the above range, in terms of effectively suppressing the swelling of a resist pattern. The lower the mass average molecular weight is within the range, the more excellent properties tends to be obtained.

Also, the dispersity (Mw/Mn) is preferably within the range of 1.0 to 5.0, and still more preferably 1.0 to 2.5.

In the component (A"), if the copolymer (A1) is used, one type of the above copolymer (A1) can be used alone, or two or more types thereof can be used in combination.

If the copolymer (A1) is used the proportion of the copolymer (A1) within the component (A") is preferably not less than 70% by weight, more preferably not less than 80% by weight, and most preferably 100% by weight.

(Copolymer (A2))

In the present invention, the copolymer (A2) includes the structural unit (a21) (hereinafter, abbreviated as structural unit (a21)) which contains an aliphatic cyclic group containing a fluorinated hydroxyalkyl group; and the structural unit (a22) (hereinafter, abbreviated as structural unit (a22)) derived from an acrylate ester containing a hydroxyl group-containing aliphatic cyclic group.

Also, the copolymer (A2) preferably further includes the structural unit (a23) (hereinafter, abbreviated as structural unit (a23)) derived from an acrylate ester containing an alcoholic hydroxyl group within the side chain thereof and no cyclic structure.

Here, in the present specification, the term "acrylic acid" is a generic term that includes acrylic acid ($CH_2=CH-COOH$) in which a hydrogen atom is bonded to the carbon atom at the α-position; an α-substituted acrylic acid in which the hydrogen atom bonded to the carbon atom at the α-position is substituted with a substituent; and a derivative of acrylic acid such as an acrylate ester described above. Examples of the substituent include a halogen atom, an alkyl group, and a halogenated alkyl group.

The term "acrylate ester" is a concept containing an acrylate ester in which a hydrogen atom is bonded to the carbon atom at the α-position, and an α-substituted acrylate ester in which a hydrogen bonded to the carbon atom at the α-position is substituted with a substituent. Examples of the substituent include a halogen atom, an alkyl group, and a halogenated alkyl group.

"Acrylate" means an acrylate in which a hydrogen atom is bonded to the carbon atom at the α-position.

Here, in "acrylic acid", "acrylate ester", and "acrylate", the term "α-position (carbon atom at the α-position)" means a carbon atom bonded to a carbonyl group, unless another specific definition is provided. Also, examples of the halogen atom include a fluorine atom, a chlorine atom, a bromine atom, and an iodine atom. Of these, a fluorine atom is particularly preferable.

The term "structural unit derived from acrylic acid" means a structural unit that is formed by the cleavage of the ethylenic double bond of acrylic acid.

The term "structural unit derived from an acrylate ester" means a structural unit that is formed by the cleavage of the ethylenic double bond of an acrylate ester.

In the acrylate ester, specific examples of the alkyl group as the substituent at the α-position include linear or branched lower alkyl groups such as a methyl group, an ethyl group, a propyl group, an isopropyl group, an n-butyl group, an isobutyl group, a tert-butyl group, a pentyl group, an isopentyl group, and a neopentyl group.

Those which are bonded to the α-position of the acrylate ester are preferably a hydrogen atom, a halogen atom, a lower alkyl group, or a halogenated lower alkyl group, and more preferably a hydrogen atom, a fluorine atom, a lower alkyl group, or a fluorinated lower alkyl group.

Structural Unit (a21)

The structural unit (a21) is a structural unit which contains an aliphatic cyclic group containing a fluorinated hydroxyalkyl group. By containing the structural unit (a21), solubility in an alkali developing solution is improved. Also swelling of the resist is suppressed, and accordingly, lithography properties such as a pattern shape and LWR are improved.

In the structural unit (a21), the aliphatic cyclic group containing a fluorinated hydroxyalkyl group is the same as those described in the structural unit (a1"), and the aliphatic cyclic group (the state before a fluorinated hydroxyalkyl group is bonded thereto) is preferably a group in which two hydrogen atoms have been removed from cyclohexane, adamantane, norbornane, or tetracyclododecane, in terms of industrial availability.

Of these monocyclic and polycyclic groups, groups in which two hydrogen atoms have been removed from norbornane are particularly preferable.

The structural unit (a21) is preferably a structural unit derived from acrylic acid, and it is particularly preferable that the structural unit (a21) be a group with a structure in which the aliphatic cyclic group described above is bonded to the oxygen atom (—O—) of the carbonyloxy group (—C(O)O—) of an acrylate ester (that is, a structure in which the hydrogen atom of the carboxyl group of acrylic acid is substituted with the aliphatic cyclic group described above).

More specifically, the structural unit (a21) is preferably a structural unit represented by the general formula (1) shown below.

[Chemical Formula 25]

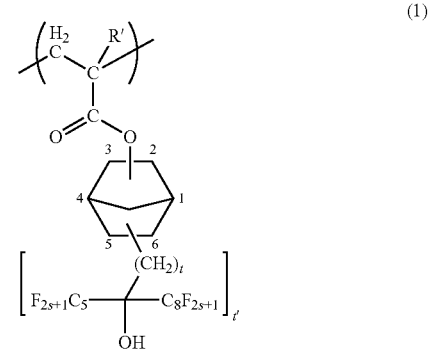

(In the formula, R' represents a hydrogen atom, a halogen atom, an alkyl group or a halogenated alkyl group; and s, t, and t' each independently represents an integer of 1 to 5.)

In the formula (1), R' represents a hydrogen, atom, a halogen atom, an alkyl group, or a halogenated alkyl group. The halogen atom, alkyl group or halogenated alkyl group for R' is the same as the halogen atom, alkyl group, or halogenated alkyl group which may be bonded to the α-position of the acrylate ester described above.

Examples of the halogen atom for R' include a fluorine atom, a chlorine atom, a bromine atom, and an iodine atom. Of these, a fluorine atom is particularly preferable.

The alkyl group for R' is preferably a linear or branched alkyl group of 1 to 5 carbon atoms, and examples thereof include a methyl group, an ethyl group, a propyl group, an isopropyl group, an n-butyl group, an isobutyl group, a tart-butyl group, a pentyl group, an isopentyl group, and a neopentyl group. Of these, a methyl group is preferable.

The halogenated alkyl group for R' is preferably a linear or branched alkyl group of 1 to 5 carbon atoms in which at least one of the hydrogen atoms are substituted with halogen atoms. Examples of the halogen atom for the substituent include the same halogen atoms as those described for and, of these, a fluorine atom is particularly preferable. Specific examples of the alkyl group are the same as those described above. The hydrogen atoms substituted with halogen atoms may be a part or all of the hydrogen atoms which constitute the alkyl group.

In the present invention, R' is preferably a hydrogen atom or a linear or branched alkyl group of 1 to 5 carbon atoms, and more preferably a hydrogen atom or a methyl group in terms of industrial availability.

s each independently represents an integer of 1 to 5, more preferably an integer of 1 to 3, and most preferably 1.

t represents an integer of 1 to 5, preferably an integer of 1 to 3, and most preferably 1.

t' represents an integer of 1 to 3, preferably an integer of 1 or 2, and most preferably 1.

The structural unit (a21) represented by the above general formula (1) is preferably a structural unit in which a 2-norbornyl group or a 3-norbornyl group is bonded to the terminal of the carboxyl group of the (α-lower alkyl)acrylic acid. It is preferable that the fluorinated alkyl alcohol in the formula (a3-3) be bonded to the 5-position or 6-position of the norbornyl group.

As the structural unit (a21), one type can be used alone, or two or more types can be used in combination.

The proportion of the structural unit (a21) within the copolymer (A2) is preferably within the range of 10 to 90 mol %, more preferably 20 to 90 mol %, still more preferably 40 to 90 mol %, and most preferably 45 to 85 mol %, based on the combined total of all structural units constituting the copolymer (A2). When this proportion is not less than the lower limit, the effects of improving solubility in an alkali developing solution, and improving lithography properties such as a pattern shape and LWR, which are obtained by including the structural unit (a21), can be achieved. On the other hand, when this proportion is not more than the upper limit, a more favorable quantitative balance can be achieved with the other structural units.

Structural Unit (a22)

The structural unit (a22) is a structural unit derived from an acrylate ester containing a hydroxyl group-containing aliphatic cyclic group. If the copolymer (A2) containing the structural unit (a22) is added to the negative resist composition, a hydroxyl group (alcoholic hydroxyl group) of the structural unit (a22) is reacted with the component (C) under action of an acid generated from the component (B), and accordingly, the copolymer (A2) changes from a soluble state to an insoluble state in an alkali developing solution.

The term "hydroxyl group-containing aliphatic cyclic group" means a group in which a hydroxyl group is bonded to an aliphatic cyclic group.

The number of the hydroxyl groups bonded to the aliphatic cyclic group is preferably 1 to 3, and more preferably 1.

The aliphatic cyclic group may be monocyclic or polycyclic, and is preferably a polycyclic group. Also, it is preferably an aliphatic cyclic hydrocarbon group. Also, it is preferably a saturated group. Also, the aliphatic cyclic group preferably has 5 to 15 carbon atoms.

Specific examples of the aliphatic cyclic group (the state before a hydroxyl group is bonded thereto) include the same as those described above for the aliphatic cyclic group in the structural unit (a21).

Of these, as the aliphatic cyclic group in the structural unit (a22), a cyclohexyl group, an adamantyl group, a norbornyl group, or a tetracyclododecanyl group is preferable in terms of industrial availability. Of these, a cyclohexyl group or an adamantyl group is more preferable, and an adamantyl group is still more preferable.

In addition to a hydroxyl group, a linear or branched alkyl group of 1 to 4 carbon atoms may also be bonded to the aliphatic cyclic group.

In the structural unit (a22), the hydroxyl group-containing aliphatic cyclic group is preferably bonded to the ester group (—C(O)O—) of an acrylate ester.

In this case, in the structural unit (a22), a substituent other than a hydrogen atom may be bonded to the α-position (the carbon atom at the α-position) of an acrylate ester. Preferable examples of the substituent include an alkyl group, a halogenated alkyl group and a halogen atom.

The substituent described above is the same as R' in the general formula (1) of the aforementioned structural unit (a21). Among those which can be bonded to the α-position, the substituent is preferably a hydrogen atom or a linear or branched alkyl group of 1 to 5 carbon atoms, more preferably a hydrogen atom or a methyl group, and most preferably a hydrogen atom.

Preferable examples of the structural unit (a22) include a structural unit represented by the general formula (2) shown below.

[Chemical Formula 26]

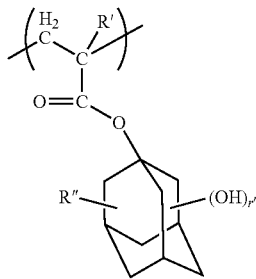

(2)

(In the formula, R' is the same as R' in the above general formula (1); R" represents a hydrogen atom, an alkyl group, or an alkoxy group of 1 to 5 carbon atoms; and r' represents an integer of 1 to 3.)

R' is the same as those described in the explanation of the above general formula (1).

The alkyl group for R" is the same as the alkyl group for R'.

In the above general formula (2), R' and R" are most preferably hydrogen atoms.

r' represents an integer of 1 to 3, and is preferably 1.

There are no particular restrictions on the binding position of the hydroxyl group, and the hydroxyl group is preferably bonded to the 3-position of the adamantyl group.

As the structural unit (a22), one type can be used alone, or two or more types can be used in combination.

The proportion of the structural unit (a22) within the copolymer (A2) is preferably within the range of 10 to 70 mol %, more preferably 10 to 50 mol %, and still more preferably 20 to 40 mol %, based on the combined total of all structural units constituting the copolymer (A2). When this proportion is not less than the lower limit, the effect of changing the copolymer (A2) from a soluble state to an insoluble state in an alkali developing solution, which is obtained by including the structural unit (a22), can be achieved. On the other hand, when this proportion is not more than the upper limit, a more favorable quantitative balance can be achieved with the other structural units.

Structural Unit (a23)

The copolymer (A2) preferably further includes the structural unit (a23) derived from an acrylate ester containing an alcoholic hydroxyl group within the side chain thereof and no cyclic structure, in addition to the structural units (a21) and (a22).

If the copolymer (A2) containing the structural unit (a23) is blended in the negative resist composition, the alcoholic hydroxyl group within the structural unit (a23) as well as the hydroxyl group within the structural unit (a22) are reacted with the component (C) under action of an acid generated from the component (B).

Therefore, the copolymer (A2) is more readily converted from a soluble state to an insoluble state in an alkali developing solution, and lithography properties such as resolution are effectively improved. Also, film thickness loss can be suppressed. Also, in pattern formation, the cross-linking reaction can be controlled more readily. Furthermore, the film density tends to be improved. Accordingly, the heat resistance tends to be improved. Also, the etching resistance is improved.

In the structural unit (a23), the expression "containing no cyclic structure" means that no aliphatic cyclic or aromatic group is contained.

Due to the fact that the structural unit (a23) contains no cyclic structure, the structural unit (a23) is clearly distinguished from the above structural unit (a22).

As an example of the structural unit containing an alcoholic hydroxyl group within the side chain thereof, a structural unit containing a hydroxyalkyl group can be mentioned.

As the hydroxyalkyl group, the same hydroxyalkyl groups as those described in "fluorinated hydroxyalkyl group" of the above structural unit (a21) can be used.

The hydroxyalkyl group may be bonded directly to the carbon atom at the α-position within the main chain (the part where the ethylenic double bond of an acrylate ester is cleaved), or may be substituted for the hydrogen atom of the carboxyl group within the acrylic acid, thereby constituting an ester.

The structural unit (a23) preferably contains at least one of or both of the hydroxyalkyl groups described above (that is, the hydroxyalkyl group bonded directly to the carbon atom at the α-position within the main chain, and/or the hydroxyalkyl group substituted for the hydrogen atom of the carboxyl group within the acrylic acid to constitute an ester).

Here, if the hydroxyalkyl group is not bonded to the α-position, an alkyl group, a halogenated alkyl group, or a halogen atom may be bonded to the carbon atom at the α-position, by being substituted for the hydrogen atom. The alkyl group, halogenated alkyl group, and halogen atom are the same as those described above in the explanation of R' in the general formula (1).

The structural unit (a23) is preferably a structural unit represented by the general formula (3) shown below,

[Chemical Formula 27]

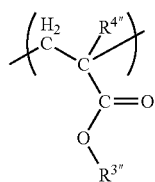

(3)

(In the formula, $R^{4\prime\prime}$ represents a hydrogen atom, an alkyl group, a halogenated alkyl group, a halogen atom, or a hydroxyalkyl group; $R^{3\prime\prime}$ represents a hydrogen atom, an alkyl group, or a hydroxyalkyl group; and at least one of $R^{4\prime\prime}$ and $R^{3\prime\prime}$ represents a hydroxyalkyl group.)

The hydroxyalkyl group for $R^{4\prime\prime}$ is preferably a linear or branched hydroxyalkyl group of 1 to 10 carbon atoms, more preferably a hydroxyalkyl group of 2 to 8 carbon atoms, and most preferably a hydroxymethyl group or a hydroxyethyl group.

There axe no particular restrictions on the number of the hydroxyl groups and the binding position thereof. Typically, the number of the hydroxyl groups is 1, and it is preferable that the hydroxyl group be bonded to the terminal of the alkyl group.

The alkyl group for $R^{4\prime\prime}$ is preferably a linear or branched alkyl group of 1 to 10 carbon atoms, more preferably an alkyl group of 2 to 8 carbon atoms, and most preferably an ethyl group or a methyl group.

The halogenated alkyl group for $R^{4\prime\prime}$ is preferably an alkyl group of 1 to 5 carbon atoms (more preferably an ethyl group or a methyl group) wherein a part or all of the hydrogen atoms are substituted with halogen atoms (preferably fluorine atoms).

Examples of the halogen atoms include a fluorine atom, a chlorine atom, a bromine atom and an iodine atom. Of these, a fluorine atom is preferable.

As the alkyl group and hydroxyalkyl group for $R^{3\prime\prime}$, the same alkyl groups and hydroxyalkyl groups as those described above for $R^{4\prime\prime}$ can be used.

Specific examples of the structural unit represented by the above general formula (3) include a structural unit derived from an α-(hydroxyalkyl)acrylic acid (wherein, the unit does not contain a structural unit derived from an acrylate ester); a structural unit derived from an alkyl α-(hydroxyalkyl)acrylate (that is, an α-(hydroxyalkyl)acrylic acid, alkyl ester); and a structural unit derived from a hydroxyalkyl (α-alkyl)acrylate (that is, an (α-alkyl)acrylic acid, hydroxyalkyl ester).

Of these, the structural unit (a23) preferably contains a structural unit derived from an alkyl α-(hydroxyalkyl)acrylate, in terms of improving film density, and more preferably contains a structural unit derived from ethyl α-(hydroxymethyl)-acrylate or methyl α-(hydroxymethyl)-acrylate.

Also the structural unit (a23) preferably contains a structural unit derived from a hydroxyalkyl (α-alkyl)acrylate, in terms of cross-linking efficiency. Of these, a structural unit derived from hydroxyethyl α-methyl-acrylate or hydroxymethyl α-methyl-acrylate is more preferable.

As the structural unit (a23), one type can be used alone, or two or more types can be used in combination.

The proportion of the structural unit (a23) within the copolymer (A2) is preferably within the range of 5 to 50 mol %, more preferably 5 to 40 mol %, still more preferably 5 to 30 mol %, and most preferably 10 to 25 mol %, based on the combined total of all structural units constituting the copolymer (A2). When this proportion is not less than the lower limit, the aforementioned effects of improving lithography properties (resolution or the like), suppressing film thickness loss, improving heat resistance, and improving etching resistance, which are obtained by including the structural unit (a23), can be achieved. On the other hand, when this proportion is not more than the upper limit, a more favorable quantitative balance can be achieved with the other structural units.

Other Structural Unit

The copolymer (A2) may include another structural unit which can be copolymerized, as a structural unit other than the structural units (a21) to (a23).

As such a structural unit, a structural unit used in a known resin component for a conventional chemically-amplified resist composition can be used, Examples thereof include a structural unit (a24) derived from an acrylate ester which contains a lactone-containing monocyclic or polycyclic group.

As the structural unit (a24), the same structural units as those described above in the explanation of the structural unit (a6) of the positive resist composition can be used.

As the structural unit (a24), one type can be used alone, or two or more types can be used in combination.

If the structural unit (a24) is included within the copolymer (A2), the proportion of the structural unit (a24) within the copolymer (A2) is preferably within the range of 10 to 70 mol %, more preferably 10 to 40 mol %, and most preferably 10 to 25 mol %, based on the combined total of all structural units constituting the copolymer (A2). When this proportion is not less than the lower limit, the effects of improving lithography properties or the like, which are obtained by including the structural unit (a24), can be obtained. On the other hand, when this proportion is not more than the upper limit, a more favorable quantitative balance can be achieved with the other structural units.

In this regard, however, in the present invention, the copolymer (A2) is preferably a resin which contains the structural units (a21) to (a23) as the main components.

Here, the expression "main components" means that the total amount of the structural units (a21) to (a23) is 50 mol % or more preferably 70 mol % or more, and more preferably 80 mol % or more. The total amount of the structural units (a21) to (a23) is most preferably 100 mol %, that is, the copolymer (A2) is preferably a copolymer consisting of the structural units (a21), (a22), and (a23).

The copolymer (A2) is particularly preferably a copolymer containing a combination of structural units represented by the formula (A2-1) shown below,

[Chemical Formula 28]

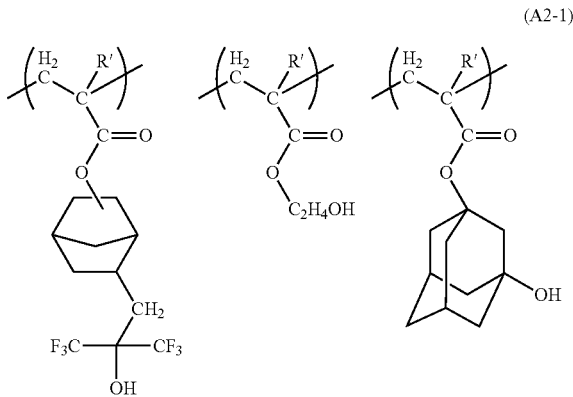

(A2-1)

(In the formula, R' is the same as R' in the above general formula (1).)

In the present invention, the weight average molecular weight (Mw; the polystyrene equivalent value determined by gel permeation chromatography) of the copolymer (A2) is preferably within the range of 2,000 to 30,000, more preferably 2,000 to 10,000, and still more preferably 3,000 to 8,000. When the mass average molecular weight is adjusted within the above range, an excellent solubility rate relative to an alkali developing solution can be obtained. Also, it is preferable in terms of high resolution. The lower the weight average molecular weight is within the above range, the more excellent properties tend to be obtained.

Further, the dispersity (Mw/Mn) is preferably within the range of 1.0 to 5.0, and more preferably 1.0 to 2.5.

In the component (A), if the copolymer (A2) is used, one type of the above component (A2) can be used alone, or two or more can be used in combination.

If the copolymer (A2) is used, the proportion of the copolymer (A2) within the component (A") is preferably not less than 50% by weight, more preferably not less than 70% by weight, still more preferably not less than 80% by weight, and most preferably 100% by weight.

The component (A") used in the present invention can be synthesized, for example, by a conventional method of radical polymerization of the monomers corresponding with each of the structural units, or a method described in International Publication WO 2004/076495.

Also, in addition to the copolymers (A1) and (A2), another polymeric compound (hydroxystyrene resin, novolak resin, acrylic resin, or the like) used in a conventional negative resist composition can be used in the component (A").

The content of the component (A") within the negative resist composition may be adjusted according to the thickness of the resist film to be formed.

[Component (B)]

As the component (B), any of the compounds appropriately selected from conventional acid generators for use within chemically-amplified resists can be used.

Examples of the component (B) include the same as those described above in the explanation of the component (B) of the positive resist composition.

As the component (B), either a single acid generator may be used alone, or two or more different acid generators may be used in combination.

In the present invention, of these, onium salts with a fluorinated alkylsulfonate ion as the anion are preferably used as the component (B), and triphenylsulfonium trifluoromethanesulfonate is most preferably used.

The quantity of the component (B) used is typically within the range of 1 to 20 parts by weight, and preferably 2 to 10 parts by weight, relative to 100 parts by weight of the component (A"). If this quantity is not less than the lower limit in the above range, then pattern formation progresses satisfactorily, whereas if the quantity is not more than the upper limit in the above range, it is easy to achieve a uniform solution, and obtain the excellent storage stability of the composition.

[Component (C)]

There are no particular restrictions on the component (C), and any known cross-linking agent that has been used in conventional chemically-amplified negative resist compositions can be used.

Specific examples include aliphatic cyclic hydrocarbons containing a hydroxyl group and/or a hydroxyalkyl group, or oxygen-containing derivatives thereof, such as 2,3-dihydroxy-5-hydroxymethylnorbornane, 2-hydroxy-5,6-bis(hydroxymethyl)norbornane, cyclohexanedimethanol, 3,4,8 (or 9)-trihydroxytricyclodecane, 2-methyl-2-adamantanol, 1,4-dioxane-2,3-diol, and 1,3,5-trihydroxycyclohexane.

Furthermore, other examples include compounds produced by reacting an amino group-containing compound such as melamine, acetoguanamine, benzoguanamine, urea, ethylene urea, propylene urea or glycoluril with either formaldehyde or a mixture of formaldehyde and a lower alcohol, thereby substituting a hydrogen atom of the amino group with a hydroxymethyl group or a lower alkoxymethyl group.

Amongst such compounds, those that use melamine are referred to as melamine-based cross-linking agents, those that use urea are referred to as urea-based cross-linking agents, those that use an alkylene urea such as ethylene urea and propylene urea are referred to as alkylene urea-based cross-linking agents, and those that use glycoluril are referred to as glycoluril-based cross-linking agents.

As the component (C), at least one compound selected from the group consisting of melamine-based cross-linking agents, urea-based cross-linking agents, alkylene urea-based cross-linking agents and glycoluril-based cross-linking agents is preferred. Of these, glycoluril-based cross-linking agents are particularly preferable.

Examples of the melamine-based cross-linking agents include compounds produced by reacting melamine and formaldehyde, thereby substituting a hydrogen atom of the amino group with a hydroxymethyl group, and compounds produced by reacting melamine, formaldehyde, and a lower alcohol, thereby substituting a hydrogen atom of the amino group with a lower alkoxymethyl group. Specific examples thereof include hexamethoxymethylmelamine, hexaethoxymethylmelamine, hexapropoxymethylmelamine, and hexabutoxybutylmelamine. Of these, hexamethoxymethylmelamine is preferred.

Examples of the urea-based cross-linking agents include compounds produced by reacting urea and formaldehyde, thereby substituting a hydrogen atom of the amino group with a hydroxymethyl group, and compounds produced by reacting urea, formaldehyde, and a lower alcohol, thereby substituting a hydrogen atom of the amino group with a lower alkoxymethyl group. Specific examples thereof include bismethoxymethylurea, bisethoxymethylurea, bispropoxymethylurea, and bisbutoxymethylurea. Of these, bismethoxymethylurea is preferred.

Examples of the alkylene urea-based cross-linking agents include compounds represented by the general formula (C-1) shown below,

[Chemical Formula 29]

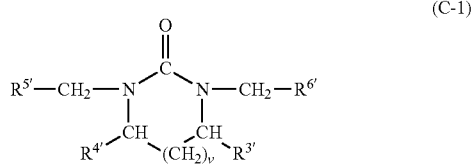

(C-1)

(In the formula, $R^{5\prime}$ and $R^{6\prime}$ each independently represents a hydroxyl group or a lower alkoxy group; $R^{5\prime}$ and $R^{4\prime}$ each independently represents a hydrogen atom, a hydroxyl group, or a lower alkoxy group; and v represents an integer of 0, 1, or 2.)

When each of $R^{5\prime}$ and $R^{6\prime}$ is a lower alkoxy group, the lower alkoxy group is preferably an alkoxy group of 1 to 4 carbon atoms, and may be linear or branched. $R^{5\prime}$ and $R^{6\prime}$ may be the same, or may be different from each other. More preferably, $R^{5\prime}$ and $R^{6\prime}$ are the same.

When each of $R^{3\prime}$ and $R^{4\prime}$ is a lower alkoxy group, the lower alkoxy group is preferably an alkoxy group of 1 to 4 carbon atoms, and may be linear or branched. $R^{3\prime}$ and $R^{4\prime}$ may be the same, or may be different from each other. More preferably, $R^{3\prime}$ and $R^{4\prime}$ are the same.

v represents an integer of 0, 1 or 2, and preferably 0 or 1.

In particular, the alkylene urea-based cross-linking agent is preferably a compound (ethylene urea-based cross-linking agent) in which v is 0, and/or a compound (propylene urea-based cross-linking agent) in which v is 1.

The compound represented by the general formula (C-1) shown above can be obtained by the condensation reaction of an alkylene urea and formaldehyde, or by the reaction of the product thus obtained with a lower alcohol.

Specific examples of the alkylene urea-based cross-linking agents include ethylene urea-based cross-linking agents such as mono- and/or dihydroxymethylated ethylene urea, mono- and/or dimethoxymethylated ethylene urea, mono- and/or diethoxymethylated ethylene urea, mono- and/or dipropoxymethylated ethylene urea, and mono- and/or dibutoxymethylated ethylene urea; propylene urea-based cross-linking agents such as mono- and/or dihydroxymethylated propylene urea, mono- and/or dimethoxymethylated propylene urea, mono- and/or diethoxymethylated propylene urea, mono- and/or dipropoxymethylated propylene urea, and mono- and/or dibutoxymethylated propylene urea; and 1,3-di(methoxymethyl)-4,5-dihydroxy-2-imidazolidinone, and 1,3-di(methoxymethyl)-4,5-dimethoxy-2-imidazolidinone.

Examples of the glycoluril-based cross-linking agents include glycoluril derivatives in which the N-position is substituted with a hydroxyalkyl group and/or an alkoxyalkyl group of 1 to 4 carbon atoms. Such glycoluril derivatives can be obtained by the condensation reaction of glycoluril and formaldehyde, or by the reaction of the product thus obtained with a lower alcohol.

Specific examples of the glycoluril-based cross-linking agents include mono-, di-, tri- or tetrahydroxymethylated glycoluril, mono-, di-, tri- or tetramethoxymethylated glycoluril, mono-, di-, tri- or tetraethoxymethylated glycoluril, mono-, di-, tri- or tetrapropoxymethylated glycoluril, and mono-, di-, tri- or tetrabutoxymethylated glycoluril.

As the component (C), one type can be used alone, or two or more types can be used in combination.

The quantity of the component (C) used is preferably within the range of 1 to 50 parts by weight, more preferably 3 to 30 parts by weight, still more preferably 3 to 15 parts by weight, and most preferably 5 to 10 parts by weight, relative to 100 parts by weight of the component (A"). Ensuring the quantity of the component (C) is not less than the lower limit, cross-linking formation progresses adequately, and an excellent resist pattern with minimal swelling can be achieved. Ensuring the quantity of the component (C) is not more than the upper limit, excellent storage stability of the resist solution applied can be obtained, and temporal deterioration of sensitivity can be suppressed.

[Component (S")]

In the present invention, the negative resist composition includes an organic solvent (S") which contains an alcohol-based organic solvent (hereinafter, referred to as component (S1)).

By including the component (S"), even if the negative resist composition is applied onto the support that the first resist pattern formed from the above positive resist composition is formed, the first resist pattern is less dissolved, and thus a resist pattern can be formed stably by the use of a double patterning method.

There are no particular restrictions on the component (S1), as long as it can uniformly dissolve each component used in the negative resist composition. Suitable examples thereof include those which have little compatibility with the first resist pattern.

Of these, the component (S1) is preferably a monohydric alcohol, more preferably a primary or secondary monohydric alcohol although it depends on the number of carbon atoms, and most preferably a primary monohydric alcohol.

The component (S1) preferably has a boiling point within the range of 80 to 160° C., more preferably 90 to 150° C., and most preferably 100 to 135° C., from the viewpoints of the resulting coating properties, the stability of the composition upon storage, and the heating temperature required in the PAB step and/or PEB step.

Here, the term "monohydric alcohol" refers to compounds in which the number of hydroxyl groups incorporated within the alcohol molecule is 1, and does not include dihydric alcohols, trihydric alcohols, or derivatives thereof.

Specific examples of the alcohol-based solvent include n-amyl alcohol (boiling point: 138.0° C.) s-amyl alcohol (boiling point: 119.3° C.), t-amyl alcohol (boiling point: 101.8° C.), isoamyl alcohol (boiling point: 130.8° C.), isobutanol (also called isobutyl alcohol or 2-methyl-1-propanol) (boiling point: 107.9° C.), isopropyl alcohol (boiling point: 82.3° C.), 2-ethylbutanol (boiling point: 147° C.), neopentyl alcohol (boiling point: 114° C.), n-butanol (boiling point: 117.7° C.), s-butanol (boiling point: 99.5° C.), t-butanol (boiling point: 82.5° C.), 1-propanol (boiling point: 97.2° C.), n-hexanol (boiling point: 157.1° C.), 2-heptanol (boiling point: 160.4° C.), 3-heptanol (boiling point: 156.2° C.), 2-methyl-1-butanol (boiling point: 128.0° C.), 2-methyl-2-butanol (boiling point: 112.0° C.), and 4-methyl-2-pentanol (boiling point: 131.8° C.). Of these, isobutanol (2-methyl-1-propanol), 4-methyl-2-pentanol, or n-butanol is preferred, because the effects due to the inclusion of the above component (5") are satisfactorily obtained, and the effects of the present invention can be improved. Of these, isobutanol or n-butanol is particularly desirable, and isobutanol is most preferable.

As the component (S1), one type can be used alone, or two or more types can be used in combination.

In the present invention, the component (51) particularly preferably contains isobutanol.

The amount of the component (S1) within the organic solvent (5") is preferably 50% by weight or more, more preferably 80% by weight or more, and most preferably 100% by weight. If the amount of the component (S1) is not less than the lower limit, the first resist pattern becomes less dissolved when the negative resist composition is applied.

Also, in the present invention, an organic solvent (hereinafter, referred to as component (52)) other than the component (S1) can be used as the component (5") together with the component (S1). If the component (52) is used together with the component (S1), solubility of the component (A") or the like, and other properties can be controlled.

As the component (S2), for example, one or more of those known as solvents for chemically-amplified resists, arbitrarily selected, can be used.

Examples of the component (52) include the same as those described above in the explanation of the component (S) of the positive resist composition.

There are no particular restrictions on the amount of the entire component (S"), and the component (S") is used within a quantity where the negative resist composition is a liquid with a concentration enough to be applied on the support.

[Optional Components]

In the negative resist composition, for improving the resist pattern shape and the post exposure stability of the latent image formed by the pattern-wise exposure of the resist layer, it is preferable to add a nitrogen-containing organic compound (D) (hereinafter referred to as component (D)) as an optional component.

Since a multitude of these components (D) have already been proposed, any of these known compounds can be used. Of these, a cyclic amine or an aliphatic amine, particularly a secondary aliphatic amine or tertiary aliphatic amine is preferred. Here, the aliphatic amine means an amine containing at least one aliphatic group, and the aliphatic group preferably has 1 to 12 carbon atoms.

Examples of the aliphatic amine include an amine (alkylamine or alkylalcoholamine) wherein at least one of the hydrogen atoms of $NH_3$ is substituted with an alkyl or hydroxyalkyl group of 1 to 12 carbon atoms.

Specific examples thereof include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcoholamines such as diethanolamine, triethanolamine, diisopropanolamine, triisopropanolamine, di-n-octanolamine, and tri-n-octanolamine.

Among these amines, alkyl alcoholamines and trialkylamines are preferable, and alkyl alcoholamines are most preferable. Of the alkyl alcoholamines, triethanolamine or triisopropanolamine is most preferable.

Examples of the cyclic amine include a heterocyclic compound containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amines include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

These may be used either alone, or in combination of two or more different compounds.

Of these, as the component (D), an alkylalcoholamine is preferably used, a tertiary alkanolamine is more preferably used, and a triethanolamine is most preferably used.

The component (D) is typically used in a quantity within the range of 0.01 to 5.0 parts by weight, relative to 100 parts by weight of the component (A).

In the present invention, by using an amine described above as the component (D), an excellent pattern shape can be readily obtained. The reason is not clear, and it is presumed that the amine has a tendency to remain in the resist film even after conducting a bake treatment in the formation of the resist pattern.

Accordingly, the second resist film formed by the negative resist composition is less affected by an alkali developing solution remaining after forming the first resist pattern, and solubility of the second resist film is suppressed, therefore it is presumed an excellent pattern shape can be readily obtained. Of these, as such an amine, an amine having a high boiling point is preferably used.

Furthermore, in the negative resist composition, for preventing any deterioration in sensitivity, and improving the resist pattern shape and the post exposure stability of the latent image formed by the pattern-wise exposure of the resist layer, at least one compound (E) (hereinafter, referred to as component (E)) selected from the group consisting of an organic carboxylic acid, or a phosphorus oxo acid or derivative thereof may be added as an optional component.

As the component (E), the same compounds as those described above in the explanation of the component (E) of the positive resist composition can be used.

As the component (E), one type may be used alone, or two or more types may be used in combination.

As the component (E), an organic carboxylic acid is preferable, and salicylic acid is particularly preferable.

The component (E) is used in a quantity within the range of 0.01 to 5.0 parts by weight, relative to 100 parts by weight of the component (A).

In the negative resist composition, if desired, additives having miscibility, for example, additive resins for improving performance of a resist film, surfactants for improving coatability, dissolution inhibitors, plasticizers, stabilizers, colorants, antihalation agents and dyes can be appropriately added.

The method of forming a resist pattern of the present invention is a method, which includes: applying a positive resist composition on a support to form a first resist film (hereinafter, referred to as film formation step (1)); selectively exposing the first resist film through a first mask pattern, and developing it to form a first resist pattern (hereinafter, referred to as patterning step (1)); applying a negative resist composition including an organic solvent (S") containing an alcohol-based organic solvent on the support that the first resist pattern is formed, thereby forming a second resist film (hereinafter, referred to as film formation step (2)); and selectively exposing the second resist film through a second mask pattern, and developing it to form a resist pattern denser than the first resist pattern (hereinafter, referred to as patterning step (2)).

With respect to the method of forming a resist pattern of the present invention, a preferred mode will be described below with reference to FIGS. 1A to 1D.

In the present mode, firstly, as shown in FIG. 1A, a positive resist composition is applied on a support 1, thereby forming a first resist film 2.

Figure 1B:
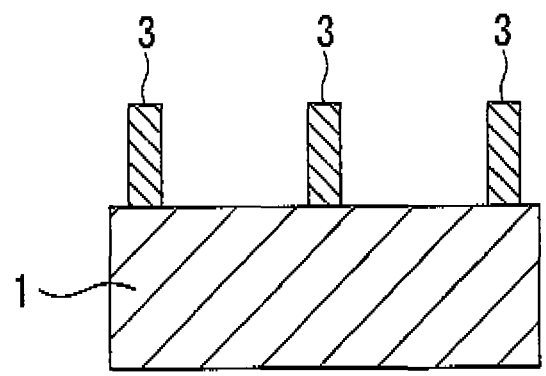

Next, as shown in FIG. 1B, the first resist film 2 is selectively exposed, and then developed, thereby forming a plurality of resist patterns 3.

Figure 1C:
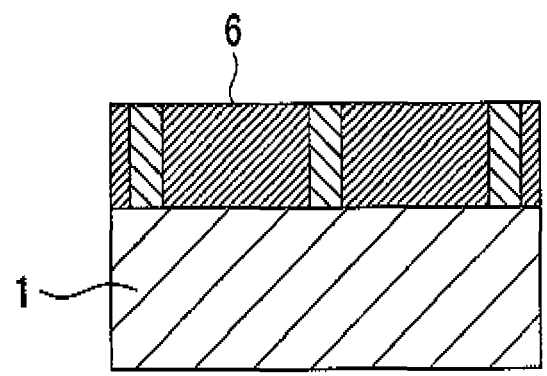

Subsequently, as shown in FIG. 1C, a negative resist composition is applied on the support 1 on which a plurality of resist patterns 3 are formed, thereby forming a second resist film 6 which fills spaces between the plurality of resist patterns 3.

Figure 1D:
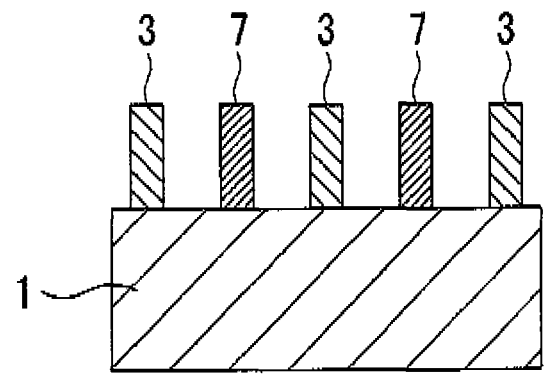

Then, as shown in FIG. 1D, portions on the second resist film 6 different from the portions at which the plurality of resist patterns 3 is formed are selectively exposed, and then developed. By the developing treatment, unexposed portions in the second resist film 6 are removed, thereby forming a resist pattern consisting of a plurality of resist patterns 7 on the support.

In this manner, a dense resist pattern can be formed on the support 1 with a pitch narrower than the resist pattern 3 formed by the patterning step (1).

Hereinafter, each step will be described in more detail.

[Film Formation Step (1)]

The support 1 is not particularly restricted, and a conventionally known support can be used. For example, substrates for electronic components, and such substrates having prescribed wiring patterns formed thereon can be used. Specific examples thereof include a silicon wafer; a substrate made of a metal such as copper, chromium, iron and aluminum; and a substrate made of glass. As materials for the wiring pattern, for example, copper, aluminum, nickel and gold can be used.

Also, as the support 1, a support in which an inorganic and/or organic film are/is provided on a substrate described above may be used. As the inorganic film, an inorganic anti-reflection film (inorganic BARC) can be used. As the organic film, organic films such as an organic anti-reflection film (organic BARC) or a lower-layer film in a multilayer resist method can be used. Particularly, if the lower-layer film is provided, a pattern with a high aspect ratio can be formed on the substrate, and is useful in the production of a semiconductor, and thus it is preferable.

Here, the multilayer resist method is a method where at least one layer of organic film (lower-layer film) and at least one layer of resist film are provided, and then patterning of the lower layer is conducted using a resist pattern formed within the resist film of the upper layer as a mask. The multilayer resist method is regarded as a method such that a pattern with a high aspect ratio can be formed. The multilayer resist method is classified into those which form a two-layer structure of an upper-layer resist film and a lower-layer film; and those which form a multilayer structure of three or more layers equipped with the above resist film, the lower-layer film, and at least one intermediate layer (thin metal film or the like) between the resist film and the lower-layer film. According to the multilayer resist method, a required thickness is retained by the lower-layer film, therefore the resist film can be thinner, and a fine pattern can be formed with a high aspect ratio.

If an organic film is provided, the organic film can be formed, for example, by applying an organic film-forming material in which a resin component or the like constituting the organic film is dissolved in an organic solvent to a substrate using a spinner or the like, and then conducting a bake treatment under heating conditions of preferably 200 to 300° C. for 30 to 300 seconds, and more preferably 60 to 180 seconds.

The organic film-forming material will be described below in more detail.

The thickness of the organic film is preferably 10 to 500 nm, and more preferably 50 to 450 nm. When the thickness is within the above range, there can be exerted such effects that a pattern having a high aspect ratio can be formed, and sufficient etching resistance can be ensured when the substrate is etched.

As the positive resist composition, any of the positive resist compositions described above, appropriately selected, can be used.

The first resist film 2 can be formed by applying the aforementioned positive resist composition on the support. The application of the aforementioned positive resist composition can be conducted by a conventional method of using a spinner or the like.

For example, the positive resist composition described above is first applied onto a support using a spinner or the like, a prebake is then conducted under temperature conditions of 80 to 150° C. for 40 to 120 seconds, preferably for 60 to 90 seconds, to volatilize the organic solvent, thereby enabling the first resist film to be formed.

The thickness of the resist film 2 is preferably within the range of 50 to 500 nm, and more preferably 50 to 450 nm. When the thickness is within the above range, there can be exerted such effects that a resist pattern with high resolution can be formed, and sufficient etching resistance can be obtained.

[Patterning Step (1)]

The patterning step (1) can be conducted by using conventional methods. Examples thereof include the following. The first resist film 2 is selectively exposed through a prescribed mask pattern, a bake treatment (post exposure baking (PEB)) is then conducted under temperature conditions of 80 to 150° C. for 40 to 120 seconds, preferably for 60 to 90 seconds, and an alkali-developing treatment is conducted using a 0.1 to 10% by weight aqueous solution of tetramethylammonium hydroxide (TMAH), thereby removing the exposed portions of the first resist film 2 formed from the positive resist composition. As a result, a first resist pattern 3 is formed.

There are no particular restrictions on the wavelength used for the exposure, and the exposure can be conducted using radiation such as KrF excimer lasers, ArF excimer lasers, $F_2$ excimer lasers, extreme ultraviolet rays (EUV), vacuum ultraviolet rays (VUV), electron beams (EB), X-rays, and soft X-rays.

The selective exposure of the first resist film 2 may be a usual exposure (dry exposure) conducted in air or an inactive gas such as nitrogen gas, or may be immersion exposure (liquid immersion lithography).

As described above, the immersion exposure is conducted under the condition where the region between a lens and a resist film on a wafer, conventionally filled with air or an inactive gas such as nitrogen gas, is filled with a solvent (immersion solvent) that has a larger refractive index than the refractive index of air.

More specifically, the immersion exposure is performed in the following manner. First, the region between the resist film obtained in the above manner and the lens at the lowermost point of the exposure apparatus is pre-filled with a solvent (immersion solvent) that has a larger refractive index than the refractive index of air, and then, while maintaining such a condition, the exposure (immersion exposure) is conducted through the desired mask pattern.

The immersion solvent is preferably a solvent that has a refractive index larger than the refractive index of air but smaller than the refractive index of the resist film formed by using the aforementioned positive resist composition. There are no restrictions on the refractive index of the immersion solvent, as long as the solvent has a refractive index within the above range.

Examples of the solvent which has a refractive index larger than that of air but smaller than that of a resist film include water, a fluorine-based inactive liquid, a silicon-based solvent, and a hydrocarbon-based solvent.

Specific examples of the fluorine-based inactive liquid include a liquid which has a fluorine-based compound as a main component, such as $C_3HCl_2F_5$, $C_4F_9OCH_3$, $C_4F_9OC_2H_5$, and $C_5H_3F_7$. The fluorine-based inactive liquid preferably has a boiling point within the range of 70 to 180° C., and more preferably 80 to 160° C. If the fluorine-based inactive liquid has a boiling point within the above range, the solvent used for the immersion lithography can be removed by a convenient method after exposure, and consequently it is preferable.

The fluorine-based inactive liquid is particularly preferably a perfluoroalkyl compound in which all hydrogen atoms of the alkyl groups are substituted with fluorine atoms. Examples of the perfluoroalkyl compounds include perfluoroalkylether compounds and perfluoroalkylamine compounds.

Specific examples of the perfluoroalkylether compounds include perfluoro(2-butyl-tetrahydrofuran) (boiling point: 102° C.), and specific examples of the perfluoroalkylamine compounds include perfluorotributylamine (boiling point: 174° C.).

[Film Formation Step (2)]

Subsequently, the negative resist composition described above is applied on the support 1 that the first resist pattern 3 is formed, thereby forming a second resist film 6 that fills spaces between the plurality of the resist patterns 3.

The second resist film 6 can be formed by a conventional method, as in the case of the first resist film 2.

The film thickness of the second resist film 6 is preferably at least the same as or thicker than the height of the resist pattern 3. That is, when the support 1 is seen from the direction of the second resist film 6, it is preferable that the surface be even (flat).

[Patterning Step (2)]

Subsequently, portions on the second resist film 6 different from the portions where the plurality of the resist patterns 3 is formed are selectively exposed, and then developed. Accordingly, resist patterns composed of the plurality of the resist patterns 3 and the plurality of the resist patterns 7 newly formed within the second resist film 6 are formed on the support 1.

Here, in the present invention, the expression "portions different from the portions where the first resist patterns are formed" is a concept which contains all of the cases except the case where the portions completely correspond with the first resist patterns formed in the patterning step (1), and it contains the case where the portions are completely not overlapped with the first resist patterns, and the case where the portions are partially overlapped with the first resist patterns.

In the present invention, it is preferable that the portions where the first resist patterns (resist patterns 3) are formed be completely not overlapped with the portions selectively exposed in the patterning step (2).

Accordingly, a narrow-pitch pattern can be formed with a pitch between patterns narrower than the pitch of the first resist pattern formed in the patterning step (1).

The selective exposure of portions different from the portions at which the first resist pattern (resist pattern 3) is formed can be conducted in the following manner. For example, if a mask pattern for a resist pattern formed in the patterning step (2) is provided on or over the mask used in the patterning step (1), the selective exposure can be conducted by horizontally moving the mask to an intended position, or by horizontally moving a stage (board which the substrate is put on) in the exposure apparatus.

Alternatively, the selective exposure can be conducted by replacing the mask with a mask for a resist pattern, formed in the patterning step (2).

The movement or replacement of the mask, or the movement of the stage can be performed by controlling the program of the exposure apparatus used.

The mask or stage may be moved parallel in one direction, or may be moved rotationally.

For example, in the case that a pattern is formed in the patterning step (2), an isolated line and space pattern is firstly formed using a line and space mask pattern in which a plurality of lines are designed with a constant pitch. Subsequently, exchanging the mask, a line pattern, is formed at the intermediate portions between the line patterns formed in the patterning step (1), thereby forming a combined line and space pattern with approximately half the pitch of the line and space formed in the patterning step (1). That is, a resist pattern denser than the isolated pattern initially formed is formed. Here, the term "isolated pattern" means a line and space pattern of "line width:space width=1:2 or more".

As described above, in the present invention, the first resist pattern is preferably a line and space resist pattern. Accordingly, a dense line and space pattern with a narrow pitch can be formed.

For example, a line and space pattern (isolated pattern) is firstly formed with a line width of 100 nm, and line width: space width=1:3 (patterning step (1)). Subsequently, using a position 200 nm from the center of the line in a direction perpendicular to the line as a base point, a line and space pattern is formed with a line width of 100 nm, and line width:space width=1:3, thereby enabling a line and space pattern (dense pattern) to be formed with a line width of 100 nm, and line width:space width=1:1 (patterning step (2)).

Also, fine and/or various resist patterns can be formed by rotationally moving the mask used in the patterning step (1), or using a mask pattern different from the mask pattern used in the patterning step (1) (for example, using a line and space mask pattern in the patterning step (1) and a hole mask pattern in the patterning step (2)).

According to the method of forming a resist pattern of the present invention, a coating step may be further conducted in which a coating layer (film) composed of a metal oxide film is formed on the surface of the formed resist pattern, after conducting the patterning step (2). Accordingly, the surface of the resist patterns 3, 3, 3 and resist patterns 7, 7 is coated by the coating film composed of a metal oxide film, and thus etching resistance is improved.

In the method of forming a resist pattern of the present invention, after conducting the above patterning step (2), a series of operations described above (the coating step, the film formation step (2), and the patterning step (2)) may be conducted repeatedly more than once.

That is, the operations of: forming a coating film composed of a metal oxide film on the surface of the formed resist pattern to form a coating pattern; applying the negative resist composition on the support that the coating pattern is formed to form a resist film; and conducting selective exposure of the resist film, and developing the resist film to form a combined pattern may be conducted repeatedly more than once. Accordingly, a denser pattern with a still narrower pitch, or a pattern with a complex shape can be formed.

In the method of forming a resist pattern of the present invention, etching of the support 1 may be conducted using the formed resist pattern, as a mask, after conducting the above patterning step (2).

That is, if an organic film is provided on the substrate, the organic film can be etched, thereby enabling a pattern (organic film pattern) faithful to the resist pattern to be formed within the organic film, and furthermore, the substrate can be etched using these patterns (resist pattern and organic film pattern) as a mask. If the resist pattern is formed directly on the substrate, the substrate can be etched using the resist pattern as a mask. By etching the substrate as described above, a semiconductor device or the like can be manufactured.

As the etching method, conventional methods can be used. For example, the method to etch the organic film is preferably a dry-etching method. Particularly, the method to etch the organic film is preferably an oxygen plasma etching method or an etching method using $CF_4$ gas or $CHF_3$ gas, from the viewpoints of the high resistance of the coating film relative to such etching, and the production efficiency. Of these, an oxygen plasma etching method is particularly preferable.

The method to etch the substrate is preferably an etching method using a halogen gas, more preferably an etching method using a fluorinated hydrocarbon-based gas, and particularly preferably an etching method using $CF_4$ gas or $CHF_3$ gas.

(Organic Film-Forming Material)

In the support 1 used in the film formation step (1), an organic film-forming material for forming an organic film which may be formed on the substrate does not always need sensitivity to an electric beam or light, which is indispensable for a resist film. A resist or a resin generally used in the production of semiconductor devices or light crystal display devices may be used as the above material.

Also, the organic film-forming material is preferably a material which can form an organic film which can be etched, particularly thy-etched, in order to etch the organic film using the resist pattern, thereby printing an image of the resist pattern on the organic film, and forming the organic film pattern. Of these, the material is preferably a material which can form an organic film which can be etched by etching such as oxygen plasma etching.

As such an organic film-forming material, a material conventionally used to form an organic film such as an organic BARC may be used. For example, ARC series manufactured by Brewer Science Ltd., AR series manufactured by Rohm and Haas Ltd., and SWK series manufactured by Tokyo Ohka Kogyo Co., Ltd. can be used.

Of these, as described above, if oxygen plasma etching is used in the etching step, the organic film is preferably constituted from a material which can be etched easily by oxygen plasma etching, and has relatively high resistance against a halogen gas, specifically against a fluorocarbon-based gas such as $CF_4$ gas or $CHF_3$ gas.

Also, an organic film which contains at least one kind of resin component selected from the group consisting of novolak resins, acrylic resins and soluble polyimides may be formed between the above organic BARC and the substrate.

These materials are suitably used in the present invention, because they can be easily etched by etching such as oxygen plasma etching, and have high resistance against a fluorocarbon-based gas. That is, since the substrate or the like is generally etched using a halogen gas such as a fluorocarbon-based gas, the organic film constituted from the above materials can improve workability using oxygen plasma etching in the formation of an organic film pattern, and also improve etching resistance in the following steps where a halogen gas such as a fluorocarbon-based gas is used for etching the substrate or the like.

One kind of these resin components may be used alone, and two or more of them may be used in combination.

Of these, novolak resins, and acrylic resins containing an aliphatic cyclic portion or an aromatic ring within the side chain thereof are preferably used, because they are inexpensive and popular, and also excel in the resistance against dry etching using a fluorocarbon-based gas.

As the novolak resin, novolak resins generally used in a positive resist composition, or positive resist for i-line and g-line in which novolak resins are included as the main component can be used.

The novolak resin is obtained, for example, by an addition condensation of aromatic compounds having a phenolic hydroxyl group (hereinafter, simply referred to as phenols) with aldehydes, in the presence of an acid catalyst.

Examples of phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinonemonomethyl ether, pyrogallol, fluoroglycinol, hydroxydiphenyl, bisphenol A, gallic acid, gallate ester, α-naphthol and β-naphthol.

Examples of aldehydes include formaldehyde, furfural, benzaldehyde, nitrobenzaldehyde, and acetaldehyde.

The catalyst used in the addition condensation reaction is not specifically limited, and for example, hydrochloric acid, nitric acid, sulfuric acid, formic acid, oxalic acid and acetic acid may be used as the acid catalyst.

As the novolak resin, those which are commercially available may be used.

The lower limit of the weight average molecular weight (Mw) of the novolak resin is preferably 3,000 or more, more preferably 5,000 or more, still more preferably 6,000 or more, and most preferably 7,000 or more. The upper limit thereof is preferably 50,000 or less, more preferably 30,000 or less, still more preferably 10,000 or less, and most preferably 9,000 or less.

When Mw is not less than 3,000, the novolak resin is hardly sublimed when baked, and thus apparatuses used are hardly contaminated. Also, when Mw is not less than 5,000, the etching resistance against a fluorinated hydrocarbon-based gas or the like is excellent, and thus it is preferable.

Also, when Mw is not more than 50,000, embedding properties relative to a substrate having fine irregularity is excellent, and particularly when Mw is not more than 10,000, dry-etching tends to be readily conducted. Consequently, it is preferable.

The novolak resin is particularly preferably a novolak resin in which the weight average molecular weight (Mw) is within the range of 5,000 to 50,000, preferably 8,000 to 30,000, and the content of a low molecular weight component having a molecular weight of 500 or less, preferably 200 or less, is 1% by weight or less, and preferably 0.8% by weight or less, determined using gel permeation chromatography. The lesser the content of the low molecular weight component, the more preferable. The content is preferably 0% by weight.

In the novolak resin having Mw within the above range, when the content of the low molecular weight component having a molecular weight of 500 or less is 1% by weight or less, embedding properties relative to a substrate having fine irregularity are improved. The reason why the embedding properties are improved by the decrease of the content of the low molecular weight component is not clear, and is presumed to be that the dispersion degree decreases.

The "low molecular weight component having a molecular weight of 500 or less" is detected as a low-molecular fraction having a molecular weight of 500 or less when analyzed by a GPC method using polystyrene standards.

The "low molecular weight component having a molecular weight of 500 or less" includes a non-polymerized monomer, and those having a low polymerization degree, such as those obtained by condensing 2 to 5 molecules of phenols with aldehydes, although this varies depending on the molecular weight.

The content (% by weight) of the low molecular weight component having a molecular weight of 500 or less is measured by plotting a fraction number (abscissa) versus a concentration (ordinate) of the analysis results obtained by the GPC method to form a graph, and determining the ratio (%) of the area under the curve of the low molecular weight component having a molecular weight of 500 or less relative to the entire area under the curve.

As the acrylic resin, there can be used those which are generally used in a positive resist composition. Examples of the acrylic resin includes an acrylic resin including a structural unit derived from a polymerizable compound having an ether bond and a structural unit derived from a polymerizable compound having a carboxyl group.

Examples of the polymerizable compound having an ether bond include (meth)acrylic acid derivatives having an ether bond and an ester bond, such as 2-methoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolypropylene glycol (meth)acrylate and tetrahydrofurfuryl (meth)acrylate. These compounds can be used alone or in combination.

Here, in the present specification, (meth)acrylate means either or both of acrylate and methacrylate.

Examples of the polymerizable compound having a carboxyl group include monocarboxylic acids such as acrylic acid, methacrylic acid and crotonic acid; dicarboxylic acids such as maleic acid, fumaric acid and itaconic acid; and compounds having a carboxyl group and an ester bond, such as 2-methacryloyloxyethylsuccinic acid, 2-methacryloyloxyethylmaleic acid, 2-methacryloyloxyethylphthalic acid and 2-methacryloyloxyethylhexahydrophthalic acid. Among these compounds, acrylic acid or methacrylic acid is preferable. These compounds can be used alone or in combination.

The soluble polyimide is a polyimide which can be formed into a liquid by the use of an organic solvent.

In the organic film-forming material, if desired, additives having miscibility, for example, additive resins for improving performance of an organic film, surfactants for improving coatability, dissolution inhibitors, plasticizers, stabilizers, colorants, and antihalation agents can be appropriately added.

The organic film-forming material can be manufactured by dissolving the aforementioned materials such as the resin components in an organic solvent. As the organic solvent, the same organic solvents as those described above in the explanation of the organic solvent of the chemically-amplified resist composition can be used.

Furthermore, a hard mask layer consisting of a silicon-based material may be used between the resist film and the organic film.

As described above, according to the present invention, there is provided a novel method of forming a resist pattern which enables a resist pattern with high resolution to be formed.

Also, according to the method of forming a resist pattern of the present invention, even if the negative resist composition is applied onto the first resist pattern formed from the positive resist composition in the patterning step (1), there is no risk of causing problems such that the first resist pattern is dissolved in an organic solvent included in the negative resist composition, thereby deteriorating the pattern shape.

In the conventional double patterning methods, there are problems such that, when the second resist composition is applied onto the first resist pattern formed from the first resist composition, a phenomenon that the first resist pattern is dissolved in an organic solvent included in the applied second resist composition, that is, the so-called mixing phenomenon, is caused. In the present invention, however, by using the combination of a positive resist composition as the first resist composition and a negative resist composition including a specific organic solvent (that is, isobutanol) as the second resist composition, the first resist pattern becomes less dissolved in the organic solvent included in the second resist composition, and thus a resist pattern can be formed with no problem.

Also, according to the method of forming a resist pattern of the present invention, there is no risk of causing problems such that the second resist film formed from the negative resist composition is dissolved in the alkali developing solution remaining even after the formation of the first resist pattern, thereby deteriorating the pattern shape.

Furthermore, according to the method of forming a resist pattern of the present invention, even if using exposure light sources with the same wavelength as used conventionally, or even if using a conventional exposure apparatus or a conventional chemically-amplified resist composition, a fine pattern can be formed.

EXAMPLES

The following is a description of examples of the present invention, although the scope of the present invention is by no way limited to these examples.

(Preparation of Negative Resist Composition)

100 parts by weight of a resin (Mw=4,200, Mw/Mn=1.43) represented by the formula (A1-1) shown below as the resin component, 3.0 parts by weight of triphenylsulfonium trifluoromethanesulfonate as the acid generator, 5.0 parts by weight of tetramethoxymethylated glycoluril (product name: MX270, manufactured by Sanwa Chemical Co., Ltd.) as the cross-linking agent, and 0.6 parts by weight of triethanolamine as the nitrogen-containing organic compound were prepared using isobutanol as the organic solvent so that the solid fraction concentration within the negative resist composition fell to 6% by weight.

[Chemical Formula 30]

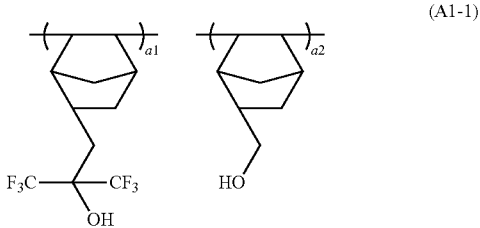

(A1-1)

(a1/a2=62/38 (molar ratio); manufactured by Promerus LLC)

Example 1

In the following procedure, a resist pattern is formed through the same steps as those shown in FIGS. 1A to 1D.

That is, an organic anti-reflection film composition (product name: "ARC29", manufactured by Brewer Science Ltd.) was applied onto an 8-inch silicon wafer using a spinner, and the composition was then baked at 205° C. for 60 seconds to be dried, thereby forming an organic anti-reflection film having a film thickness of 30 nm.

An ArF resist composition (product name: "TArF-P6239", manufactured by Tokyo Ohka Kogyo Co., Ltd.) was applied onto the antireflection film using a spinner, followed by drying by conducting a prebake (PAB) treatment on a hotplate at 80° C. for 60 seconds, thereby forming a positive resist film having a film thickness of 160 nm.

Subsequently, the obtained positive resist film was selectively exposed by an ArF excimer laser (193 nm), using an ArF exposure apparatus "NSR-S302" (manufactured by Nikon; numerical aperture (NA)=0.60, 2/3 annual, illumination) through a mask pattern.

Thereafter, a post exposure baking (PEB) treatment was conducted at 100° C. for 60 seconds, followed by a developing treatment for 60 seconds at 23° C. in a 2.38% by weight aqueous solution of tetramethylammonium hydroxide (TMAH).

As a result, a line and space resist pattern (hereinafter, referred to as pattern (1)) in which line patterns with a line width of 75 nm were allocated at even intervals (a pitch of 300 nm) was formed within the positive resist film.

Next, the negative resist composition obtained above was applied on the substrate that the pattern (1) was formed under the same conditions as those described above, and then a PAB treatment was conducted, thereby forming a negative resist film.

Subsequently, the negative resist film was selectively exposed by an ArF excimer laser (193 nm), using the same ArF exposure apparatus as that described above, thereby forming a trench pattern of 275 nm at each of the line portions on the above pattern (1).

Thereafter, a developing treatment was conducted under the same conditions as those described above.

As a result, after the second patterning was conducted, a pattern denser than the pattern (1), that is, a line and space pattern with a space width of 100 nm and a line width of 75 nm, was formed.

Therefore, in the Examples of the present invention, it could be confirmed that a resist pattern with high resolution could be formed.

Also, it could be confirmed that the pattern (1) maintained the shape thereof before the negative resist composition was applied thereon, even after conducting the second patterning without being dissolved.

INDUSTRIAL APPLICABILITY

According to the present invention, there is provided a novel method of forming a resist pattern which enables a resist pattern with high resolution to be formed. Particularly, according to the method of the present invention, a resist pattern can be formed without causing problems such as mixing caused in conventional double patterning methods.

Also, according to the method of the present invention, a very fine pattern can be formed even if using exposure light sources with the same exposure wavelength as used conventionally, or even if using a conventional exposure apparatus or a conventional chemically-amplified resist composition.

The invention claimed is:

1. A method of forming a resist pattern, comprising:
applying a positive resist composition on a support to form a first resist film;
conducting selective exposure of the first resist film through a first mask pattern, and developing the first resist film to form a first resist pattern;
applying a negative resist composition which comprises an organic solvent (S") containing an alcohol-based organic solvent on the support that the first resist pattern is formed, thereby forming a second resist film; and
conducting selective exposure of the second resist film through a second mask pattern, and developing the second resist film to form a resist pattern denser than the first resist pattern, wherein
the positive resist composition comprises a resin component (A-12) comprising a structural unit (a5) derived from an (α-lower alkyl)acrylate ester having an acid dissociable, dissolution inhibiting group, structural unit (a6) derived from an (α-lower alkyl)acrylate ester that contains a lactone-containing group and a structural unit (a7) derived from an acrylate ester that contains a polar group-containing polycyclic group, and at least one organic solvent (S) selected from the group consisting of lactones, ketones, propylene glycol monomethyl ether acetate (PGMEA), ethyl lactate (EL) and propylene glycol monomethyl ether (PGME).

2. The method of forming a resist pattern according to claim 1, wherein the first resist pattern is a line and space resist pattern.

3. The method of forming a resist pattern according to claim 1, wherein the alcohol-based organic solvent comprises isobutanol.

4. The method of forming a resist pattern according to claim 1, wherein the negative resist composition comprises an alkali-soluble resin component (A"), an acid generator component (B) which generates an acid upon exposure, a cross-linking agent component (C), and the organic solvent (S").

5. The method of forming a resist pattern according to claim 4, wherein the alkali-soluble resin (A") comprises a copolymer (A1) including: a structural unit (a1") which contains an aliphatic cyclic group containing a fluorinated hydroxyalkyl group within the main chain thereof; and a structural unit (a2") which contains a hydroxyalkyl group.

6. The method of forming a resist pattern according to claim 4 or 5, wherein the cross-linking agent component (C) is at least one selected from the group consisting of a melamine-based cross-linking agent, an urea-based cross-linking agent, an alkylene urea-based cross-linking agent and a glycoluril-based cross-linking agent.

7. The method of forming a resist pattern according to claim 4, wherein the negative resist composition further comprises a nitrogen-containing organic compound (D).

8. The method of forming a resist pattern according to claim 1, wherein the negative resist composition further comprises an alkali-soluble resin component (A") comprising a copolymer (A1) including: a structural unit (a1") which contains an aliphatic cyclic group containing a fluorinated hydroxyalkyl group within the main chain thereof.

9. The method of forming a resist pattern according to claim 8, wherein the structural unit (a1") comprises a structural unit (a1-1) represented by the general formula (a1-1) shown below:

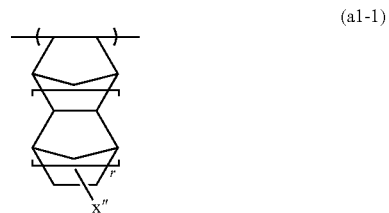

(a1-1)

(In the formula, X" represents a fluorinated hydroxyalkyl group; and r represents an integer of 0 or 1).

* * * * *

UNITED STATES PATENT AND TRADEMARK OFFICE
CERTIFICATE OF CORRECTION

PATENT NO. : 8,043,795 B2
APPLICATION NO. : 12/441704
DATED : October 25, 2011
INVENTOR(S) : Jun Iwashita It is certified that error appears in the above-identified patent and that said Letters Patent is hereby corrected as shown below:

At Column 1 (item 73) (Assignee), Line 1, Change "Ohika" to --Ohka--.

At (Item 56), Page 2, Col. 2, Line 7, Under Other Publications, change "SPIE," to --SPIE, Feb. 20, 2006,--.

At Column 2, Line 53, Change "No," to --No.--.

At Column 11, Line 29-30, Delete "The carboxyl group thus generated improves adhesion with a coating layer formed on the resist pattern." and insert the same after "generated." on Page 11, Line 28 as a continuation of same paragraph.

At Column 12, Line 22 (Approx.), Change "alicylic" to --alicyclic--.

At Column 14, Line 50, Change "below," to --below.--.

At Column 14, Lines 54-64 (Approx.),

Change " 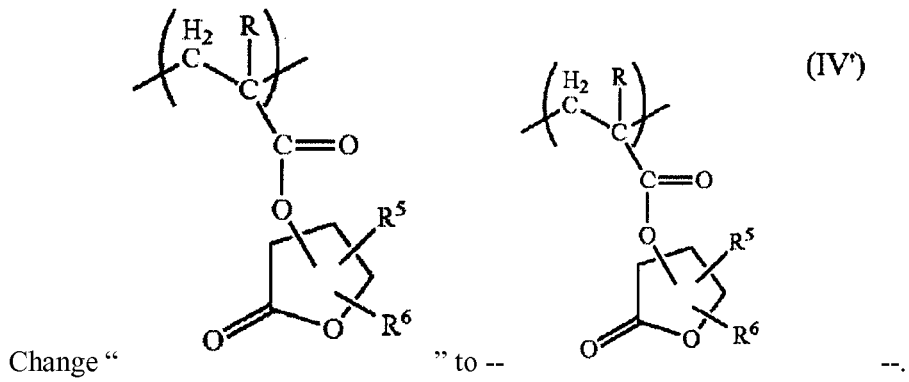 " to -- --.

At Column 18, Line 64, Change "(a7)," to --(a7).--.

At Column 21, Line 39, Change "(5)." to --(S).--.

At Column 25, Line 39 (Approx.), Change "(A1)," to --(A1).--.

At Column 28, Line 42 (Approx.), Change "Also" to --Also,--.

At Column 28, Line 53 (Approx.), Change "hi" to --in--.

Signed and Sealed this
Fifteenth Day of May, 2012

David J. Kappos
*Director of the United States Patent and Trademark Office*

At Column 30, Line 64, Change "used" to --used,--.

At Column 31, Line 60, Change "Also" to --Also,--.

At Column 32, Line 42 (Approx.), Change "hydrogen, atom," to --hydrogen atom,--.

At Column 32, Line 54 (Approx.), Change "tart-" to --tert- --.

At Column 32, Line 62, Change "for" to --for R'--.

At Column 35, Line 47 (Approx.), Change "below," to --below.--.

At Column 36, Line 37, Change "Also" to --Also,--.

At Column 37, Line 32 (Approx.), Change "below," to --below.--.

At Column 39, Line 33 (Approx.), Change "below," to --below.--.

At Column 39, Line 47 (Approx.), Change "$R^{5}$"" to --$R^{3}$'--.

At Column 41, Line 9 (Approx.), Change "C.)" to --C.),--.

At Column 41, Line 26 (Approx.), Change "(5")" to --(S")--.

At Column 41, Line 32 (Approx.), Change "(51)" to --(S1)--.

At Column 41, Line 42, Change "(52))" to --(S2)--.

At Column 41, Line 43, Change "(5")" to --(S")--.

At Column 41, Line 44, Change "(52)" to --(S2)--.

At Column 41, Line 50, Change "(52)" to --(S2)--.

At Column 46, Line 38, Change "pattern," to --pattern--.

At Column 48, Line 55, Change "fluoroglycinol," to --phloroglucinol,--.

At Column 51, Line 47, Change "annual," to --annual--.

At Column 52, Lines 19-22, Delete "Particularly, according to the method of the present invention, a resist pattern can be formed without causing problems such as mixing caused in conventional double patterning methods." and insert the same below "formed." on Col. 52, Line 20 as a new paragraph.